(12) United States Patent
Xie et al.

(10) Patent No.: US 9,929,048 B1
(45) Date of Patent: Mar. 27, 2018

(54) MIDDLE OF THE LINE (MOL) CONTACTS WITH TWO-DIMENSIONAL SELF-ALIGNMENT

(71) Applicant: GLOBALFOUNDRIES INC., Grand Cayman (KY)

(72) Inventors: Ruilong Xie, Schenectady, NY (US); Chanro Park, Clifton Park, NY (US); Andre Labonte, Mechanicville, NY (US); Lars Liebmann, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/388,400

(22) Filed: Dec. 22, 2016

(51) Int. Cl.
| | |
|---|---|
| *H01L 21/768* | (2006.01) |
| *H01L 21/033* | (2006.01) |
| *H01L 29/66* | (2006.01) |
| *H01L 23/535* | (2006.01) |
| *H01L 23/522* | (2006.01) |
| *H01L 23/532* | (2006.01) |

(52) U.S. Cl.
CPC .... *H01L 21/76897* (2013.01); *H01L 21/0332* (2013.01); *H01L 21/76805* (2013.01); *H01L 23/5226* (2013.01); *H01L 23/535* (2013.01); *H01L 23/5329* (2013.01); *H01L 29/66545* (2013.01)

(58) Field of Classification Search
None
See application file for complete search history.

(56) References Cited

U.S. PATENT DOCUMENTS

| | | |
|---|---|---|
| 6,787,469 B2 | 9/2004 | Houston et al. |
| 2009/0065814 A1 | 3/2009 | Bhalla et al. |
| 2009/0065855 A1 | 3/2009 | Bhalla et al. |
| 2009/0065861 A1 | 3/2009 | Bhalla et al. |

(Continued)

OTHER PUBLICATIONS

U.S. Appl. No. 15/354,212, Restriction Requirement dated Oct. 4, 2017, 7 pages.

(Continued)

*Primary Examiner* — Asok K Sarkar
*Assistant Examiner* — Grant Withers
(74) *Attorney, Agent, or Firm* — Gibb & Riley, LLC; Francois Pagette

(57) ABSTRACT

Disclosed are methods of forming an integrated circuit (IC) structure with self-aligned middle of the line (MOL) contacts and the resulting IC structure. In the methods, different, selectively etchable, dielectric materials are used above the gate level for: a dielectric cap above a gate; a dielectric spacer above a gate sidewall spacer and laterally surrounding the dielectric cap; and a stack of dielectric layer(s) that covers the dielectric cap, the dielectric spacer, and metal plugs positioned laterally adjacent to the dielectric spacer and above source/drain regions. Due to the different dielectric materials, subsequently formed gate and source/drain contacts are self-aligned in two dimensions to provide protection against the occurrence of opens between wires and/or vias in the first BEOL metal level and the contacts and to further provide protection against the occurrence of shorts between the gate contact and any metal plugs and between the source/drain contacts and the gate.

20 Claims, 30 Drawing Sheets

(56) References Cited

U.S. PATENT DOCUMENTS

| | | | |
|---|---|---|---|
| 2014/0077305 A1 | 3/2014 | Pethe et al. | |
| 2014/0264444 A1* | 9/2014 | Guo | H01L 29/66477 257/192 |
| 2014/0284671 A1* | 9/2014 | Hung | H01L 21/28 257/296 |
| 2015/0214113 A1 | 7/2015 | Bouche et al. | |
| 2016/0293485 A1 | 10/2016 | Song et al. | |

OTHER PUBLICATIONS

U.S. Appl. No. 15/354,212, Notice of Allowance dated Jan. 5, 2018, 22 pages.

* cited by examiner

MIDDLE OF THE LINE (MOL) CONTACTS WITH TWO-DIMENSIONAL SELF-ALIGNMENT

FIELD OF THE INVENTION

The present invention relates to the middle of the line (MOL) contacts that connect field effect transistors (FETs) to back end of the line (BEOL) metal levels. More particularly, the present invention relates to integrated circuit (IC) structures and methods of forming these IC structures so as to have MOL contacts (e.g., gate and source/drain contacts) with two-dimensional self-alignment and, thus, so that gate contact(s) can, optionally, be formed within an active region of a FET (or close thereto).

BACKGROUND

Integrated circuit (IC) structures have middle of the line (MOL) contacts that connect field effect transistors (FETs) to back end of the line (BEOL) metal levels. The MOL contacts include at least one gate contact (also referred to herein as a CB contact) and source/drain contacts (also referred to herein as CA contacts). Each gate contact extends vertically through the interlayer dielectric (ILD) material from a metal wire or via in the first BEOL metal level (also referred to herein as the $M_0$ level) to the gate of the FET. Each source/drain contact extends vertically through the ILD material from a metal wire or via in the first BEOL metal level to a metal plug (also referred to herein as a TS contact), which is above and immediately adjacent to a source/drain region of the FET. Conventional techniques for forming these MOL contacts inherently include risks of the following: (a) opens (also referred to herein as voids) occurring between the first BEOL metal level and both the source/drain contacts and the gate contact; (b) shorts occurring between the gate contact and a metal plug, particularly, if the gate contact is to be formed on a portion of the gate above the active region of the FET (i.e., particularly, if the gate contact is a gate contact over active, also referred to herein as a CBoA) in order to allow for size scaling; and (c) shorts occurring between the source/drain contacts and the gate. Thus, there is a need in the art for an improved method of forming an IC structure with MOL contacts in a manner that avoids the occurrence of the above-described opens and shorts.

SUMMARY

In view of the foregoing, disclosed herein are methods of forming an integrated circuit (IC) structure with self-aligned middle of the line (MOL) contacts. Generally, these methods include forming at least one field effect transistor (FET). The FET can be formed so as to have a semiconductor body and, in the semiconductor body, source/drain regions and a channel region positioned laterally between the source/drain regions. The FET can further be formed so as to have a gate with a gate sidewall spacer above the semiconductor body at the channel region. A dielectric spacer can be formed above the gate sidewall spacer. A dielectric cap can be formed above the gate so as to be laterally surrounded by and immediately adjacent to the dielectric spacer. Additionally, metal plugs can be formed above the semiconductor body at the source/drain regions such that the metal plugs are positioned laterally adjacent to the dielectric spacer opposite the dielectric cap.

To complete the IC structure, both middle of the line (MOL) contacts and back end of the line (BEOL) metal levels can be formed. Specifically, at least one dielectric layer can be formed over the dielectric cap, the dielectric spacer and the metal plugs. Trenches can be formed in an upper portion of the dielectric layer(s) and contact openings can be formed that extend from the trenches through a lower portion of the dielectric layer(s). The contact openings can include, but are not limited to, a first contact opening that extends from a first trench through the lower portion of the dielectric layer(s) and the dielectric cap to the gate and a second contact opening that extends from a second trench through the lower portion of the dielectric layer(s) to a metal plug. After the trenches and contact openings are formed, metal can be deposited to form wires in the trenches and contacts in the contact openings (e.g., a first contact to the gate in the first contact opening and a second contact to a metal plug in the second contact opening). It should be noted, in these methods, the dielectric cap, the dielectric spacer, and the dielectric layer(s) are specifically made of different dielectric materials such that the first contact and second contact are each self-aligned (e.g., in two different dimensions).

The IC structures formed according to these methods can include, but are not limited to, IC structures that incorporate planar FET(s) or non-planar FET(s), IC structures that incorporate FET(s) with multiple semiconductor bodies, IC structures that incorporate FET(s) with conventional gate-first gate(s) or replacement metal gate(s), etc.

Thus, for example, one particular method embodiment disclosed herein can be used to form an IC structure with self-aligned MOL contacts to multiple non-planar FETs. This particular method embodiment can include forming the non-planar FETs. To form the FETs, multiple semiconductor body can be formed. Each semiconductor body can have multiple channel regions, each channel region positioned laterally between source/drain regions. Sacrificial gates with gate sidewall spacers can be formed on the semiconductor bodies adjacent to the channel regions. Raised source/drain regions can be formed on the semiconductor bodies at the source/drain regions such that the raised source/drain regions are positioned laterally adjacent to the gate sidewall spacers. A first interlayer dielectric (ILD) layer can be formed so as to cover the sacrificial gates, the gate sidewall spacers and the raised source/drain regions. After the first ILD layer is formed, it can be planarized to expose the tops of the sacrificial gates and gate sidewall spacers and the sacrificial gates can be replaced with replacement metal gates.

The replacement metal gates and the gate sidewall spacers can subsequently be recessed and dielectric spacers can be formed on exposed vertical surfaces of the first ILD layer above each gate sidewall spacer. Next, dielectric caps can be formed on the replacement metal gates such that each dielectric cap is laterally surrounded by and immediately adjacent to a dielectric spacer. Additionally, metal plug openings, which extend through the first ILD layer to the raised source/drain regions, can be formed. Metal plugs can be formed in the metal plug openings and then recessed, thereby forming recessed metal plugs.

To complete the IC structure, both middle of the line (MOL) contacts and back end of the line (BEOL) metal levels can be formed. Specifically, a stack of dielectric layers can be deposited over the dielectric caps, the dielectric spacers, and the recessed metal plugs. This stack of dielectric layers can include a second ILD layer and a hardmask layer on the second ILD layer. Trenches can be formed in an upper portion of the stack and contact openings can be formed that extend from the trenches through a lower portion of the stack. The contact openings can include, but are not limited to, a first contact opening that extends from a first trench through the lower portion of the stack and through a dielectric cap to a replacement metal gate and a second contact opening that extends from a second trench through the lower portion of the stack to a metal plug. After the trenches and contact openings are formed, metal can be deposited to form wires in the trenches and contacts in the contact openings (e.g., a first contact to the replacement metal gate in the first contact opening and a second contact to the metal plug in the second contact opening). In this method embodiment, the dielectric caps, the dielectric spacers, and each of the dielectric layers in the stack are specifically made of different dielectric materials so that the first contact and second contact will be self-aligned in two different dimensions.

Also disclosed herein are integrated circuit (IC) structures formed according to the methods described above. Generally, each IC structure includes at least one field effect transistor (FET). The FET can have at least one semiconductor body and, in the semiconductor body, a channel region positioned laterally between source/drain regions. A gate can be above the semiconductor body at the channel region. A gate sidewall spacer can be on the sidewalls of the gate, a dielectric cap can be on a top surface of the gate, and a dielectric spacer can be above the gate sidewall spacer so as to laterally surround and be immediately adjacent to the dielectric cap. Metal plugs can be above the source/drain regions and positioned laterally adjacent to the dielectric spacer.

Each IC structure can further have both middle of the line (MOL) contacts and back end of the line (BEOL) metal levels. That is, at least one dielectric layer can be above the dielectric cap, the dielectric spacer and the metal plugs. Wires can be in an upper portion of the at least one dielectric layer and contacts can extend from the wires through a lower portion of the at least one dielectric layer. These contacts can include, but are not limited to, a first contact that extends from a first wire through the lower portion of the at least one dielectric layer and through the dielectric cap to the gate and a second contact that extends from a second wire through the lower portion of the at least one dielectric layer to a metal plug. It should be noted that, in the IC structures, the dielectric cap, the dielectric spacer, and the at least one dielectric layer are all specifically made of different dielectric materials such that the first contact and the second contact are each self-aligned (e.g., in two different dimensions).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuit (IC) structures have middle of the line (MOL) contacts that connect field effect transistors (FETs) to back end of the line (BEOL) metal levels. The MOL contacts include at least one gate contact (also referred to herein as a CB contact) and source/drain contacts (also referred to herein as CA contacts). Each gate contact extends vertically through the interlayer dielectric (ILD) material from a metal wire or via in the first BEOL metal level (also referred to herein as the M0 level) to the gate of the FET. Each source/drain contact extends vertically through the ILD material from a metal wire or via in the first BEOL metal level to a metal plug (also referred to herein as a TS contact), which is above and immediately adjacent to a source/drain region of the FET. Conventional techniques for forming these MOL contacts inherently include risks of the following: (a) opens (also referred to herein as voids) occurring between the first BEOL metal level and both the source/drain contacts and the gate contact; (b) shorts occurring between the gate contact and a metal plug, particularly, if the gate contact is to be formed on a portion of the gate above the active region of the FET (i.e., particularly, if the gate contact is a gate contact over active, also referred to herein as a CBoA) in order to allow for size scaling; and (c) shorts occurring between the source/drain contacts and the gate.

In view of the foregoing, disclosed herein are methods of forming an integrated circuit (IC) structure with self-aligned middle of the line (MOL) contacts to at least one field effect transistor (FET). In the methods, different, selectively etchable, dielectric materials are used above the gate level for at least the following: a dielectric cap above a gate; a dielectric spacer above a gate sidewall spacer and laterally surrounding the dielectric cap; and at least one dielectric layer that covers the dielectric cap, the dielectric spacer, and metal plugs positioned laterally adjacent to the dielectric spacer and above source/drain regions. Due to the different dielectric materials used above the gate level, subsequently formed gate and source/drain contacts will be self-aligned (e.g., in two different dimensions) to provide protection against the occurrence of opens between wires and/or vias in the first BEOL metal level and the various contacts and to further provide protection against the occurrence of shorts between the gate contact and any metal plugs and between the source/drain contacts and the gate. Also disclosed herein are IC structures formed according to the methods.

Figure 1:
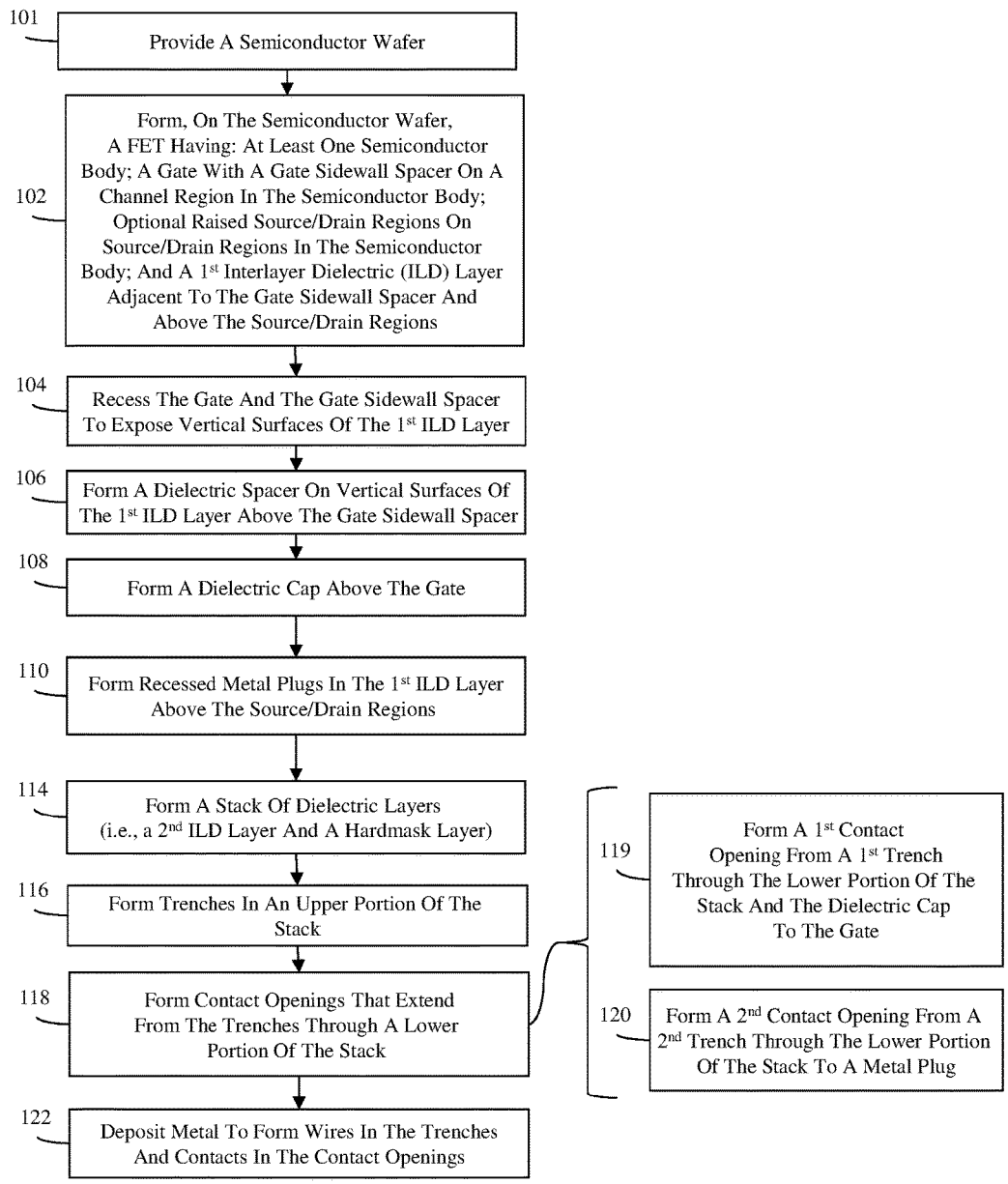
FIG. 1 is a flow diagram illustrating methods of forming an integrated circuit (IC) structure with self-aligned middle of the line (MOL) contacts to at least one field effect transistor (FET)

Referring to the flow diagram of FIG. 1, generally in the methods disclosed herein a semiconductor wafer is provided (101) and at least one field effect transistor (FET) can be formed on the semiconductor wafer (102). Each FET can be formed so that it has one or more semiconductor bodies. Each semiconductor body can be a planar semiconductor body for a planar FET or a non-planar semiconductor body (e.g., a semiconductor fin) for a non-planar FET, such as a fin-type FET (finFET) or a trigate FET. In any case, each semiconductor body can have areas designated for source/drain regions and for a channel region positioned laterally between the source/drain regions. The FET can further be formed so that it has a gate adjacent to the channel region (or channel regions in the case of multiple semiconductor bodies), a gate sidewall spacer adjacent to the gate and a first interlayer dielectric (ILD) layer positioned laterally immediately adjacent to the gate sidewall spacer and above the source/drain regions. The gate can be a conventional gate-first gate (e.g., a gate with a silicon dioxide gate dielectric layer and a polysilicon gate conductor layer or any other suitable gate-first gate configuration). Alternatively, this gate can be a replacement metal gate (e.g., a gate with a high-K gate dielectric layer and a metal gate conductor layer or any other suitable replacement metal gate configuration) formed by removing a previously formed sacrificial gate and replacing that sacrificial gate with a metal gate (as discussed in greater detail below). In any case, those skilled in the art will recognize that, in the case of a planar FET, the gate will be positioned adjacent to the top surface of each semiconductor body at the channel region, whereas, in the case of a non-planar FET, the gate will be positioned adjacent to opposing sidewalls and, optionally, above the top surface of each semiconductor body at the channel region.

In the methods described herein, the gate and the gate sidewall spacer can be recessed to expose vertical surfaces of the first ILD layer (104), a dielectric spacer can be formed on the exposed vertical surfaces of the first ILD layer above the gate sidewall spacer (106), and a dielectric cap can be formed above the gate such that it is laterally surrounded by and immediately adjacent to the dielectric spacer (108). Additionally, metal plugs can be formed within the first ILD layer above the source/drain regions such that the dielectric spacer is positioned laterally between each metal plug and the dielectric cap (110). After the metal plugs are formed, they too can be recessed to form recessed metal plugs and to expose additional vertical surfaces of the first ILD layer.

To complete the IC structure, both middle of the line (MOL) contacts and back end of the line (BEOL) metal levels can be formed. Specifically, at least one dielectric layer (e.g., a stack of dielectric layers including a second ILD layer and a hardmask layer on the second ILD layer) can be formed over the dielectric cap, the dielectric spacer and the recessed metal plugs (114). Trenches can then be formed in an upper portion of the dielectric layer(s) (116) and contact openings can be formed that extend from the trenches through a lower portion of the dielectric layer(s) (118). The contact openings can include, but are not limited to, a first contact opening that extends from a first trench through the lower portion of the dielectric layer(s) and through the dielectric cap to the gate (e.g., aligned above an active region of the FET or close thereto) (119) and a second contact opening that extends from a second trench through the lower portion of the dielectric layer(s) to a metal plug (120). After the trenches and contact openings are formed, metal can be deposited to form wires in the trenches and contacts in the contact openings (e.g., a first contact to the gate in the first contact opening and a second contact to a metal plug in the second contact opening) (122).

It should be noted that, at process 106-114 described above, the dielectric cap, the dielectric spacer, and the dielectric layer(s) are specifically made of different dielectric materials such that various selective etch processes can be used at process 118 to form the contact openings. As a result, the contacts, including the first contact and the second contact, will each be self-aligned (e.g., in two different dimensions), as discussed in greater detail below with regard to a particular method embodiment and illustrated in the Figures. Those skilled in the art will recognize that, due to the self-alignment of the contacts and, particularly, the self-alignment of the first contact to the gate, the first contact can be formed so that it lands on the gate above the active region of the FET (or close thereto) as opposed to above adjacent isolation material without risking the occurrence of a short between the first contact and any metal plugs. Thus, the methods allow for device size scaling.

The IC structures formed according to the disclosed methods can include, but are not limited to, IC structures that incorporate planar FET(s) or non-planar FET(s), IC structures that incorporate FET(s) with multiple semiconductor bodies, IC structures that incorporate FET(s) with conventional gate-first gate(s) or a replacement metal gate(s), etc. Thus, for purposes of illustration, the method steps 101-122 are described in greater detail below with reference to the formation of an IC structure with self-aligned MOL contacts to multiple non-planar FETs (e.g., multiple finFETs).

Referring again to the flow diagram of FIG. 1, this method embodiment can include providing a semiconductor wafer (101) and forming multiple non-planar FETs on the semiconductor wafer (102).

Figure 2A:
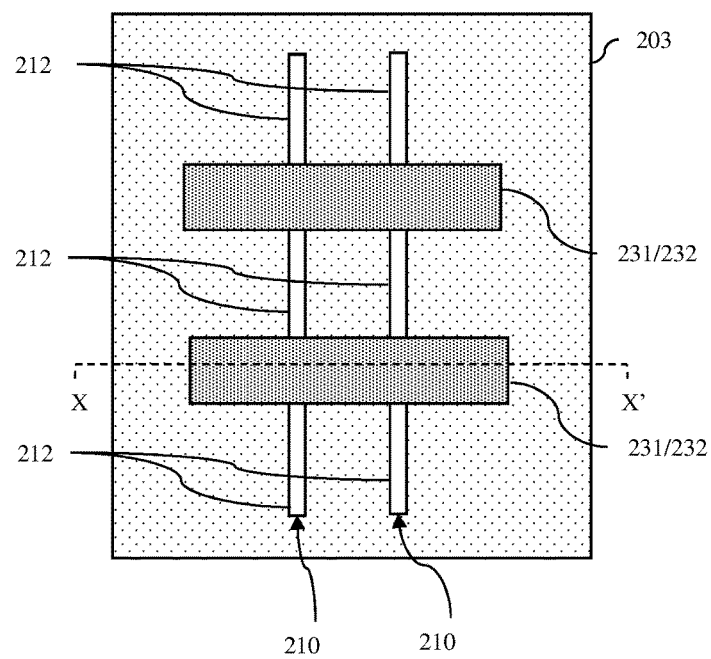
FIGS. 2A-2B are top view and cross-section diagrams, respectively, illustrating a partially completed structure formed according to the methods of FIG. 1.
Figure 2B:
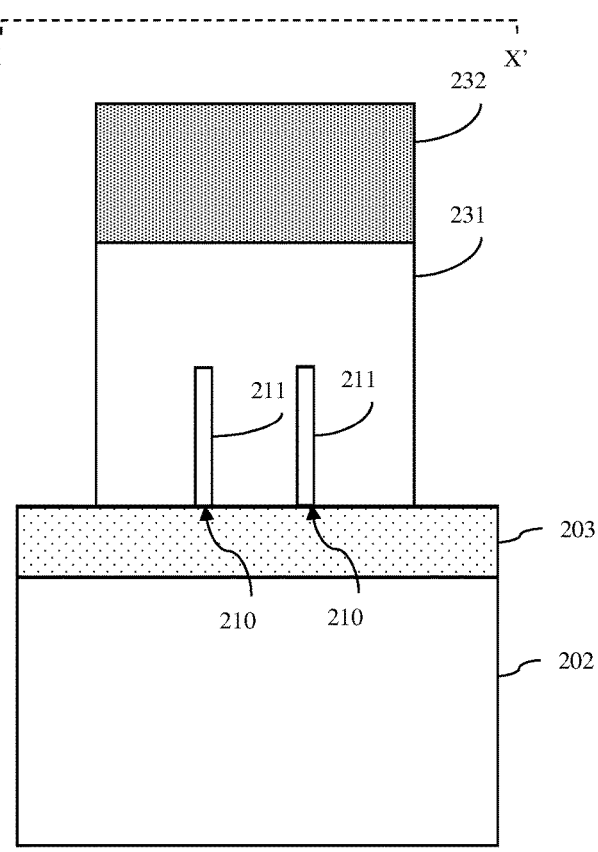

The semiconductor wafer provided at process 101 can be, for example, a semiconductor-on-insulator (SOI) wafer, as shown in FIG. 2B, that includes a semiconductor substrate 202 (e.g., a silicon substrate), an insulator layer 203 (e.g., a buried oxide (BOX) layer or other suitable insulator layer on the semiconductor substrate) and a semiconductor layer (e.g., a silicon layer or other suitable semiconductor layer) on the insulator layer 203. Alternatively, a bulk semiconductor wafer (e.g., a bulk silicon wafer or other suitable bulk semiconductor wafer) could be used.

Multiple semiconductor bodies 210 can be formed at process 102 such that each semiconductor body has areas designated for multiple channel regions 211 with each channel region being positioned laterally between a pair of source/drain regions 212. For purposes of illustration, FIGS. 2A-2B show a pair of semiconductor bodies 210, wherein each semiconductor body has a first channel region and a second channel region separated by a shared source/drain region. In any case, each semiconductor body 210 can be a fin-shaped semiconductor body (i.e., relatively thin rectangular semiconductor body). Fin-shaped semiconductor bodies can be patterned and etched from the semiconductor layer of the SOI wafer (or, alternatively, from the upper portion of a bulk semiconductor substrate, when isolation from the lower portion of the bulk semiconductor substrate is provided by buried well regions). Techniques for forming such fin-shaped semiconductor bodies (e.g., lithographic patterning techniques or sidewall image transfer techniques) are well known in the art and, thus, the details have been omitted from this specification in order to allow the reader to focus on the salient aspects of the disclosed method. It should be noted that the semiconductor bodies can be appropriately doped with a first dopant, either before or after formation, so that the channel regions 211 will have a first-type conductivity at a relatively low conductivity level.

At process 102, replacement metal gates with gate sidewall spacers can be formed across the semiconductor bodies 210 such that each replacement metal gate with a gate sidewall spacer is positioned above the top surfaces and adjacent to the opposing sides of the semiconductor bodies at adjacent channel regions 211 (104). To form the replacement metal gates at process 104, a blanket first sacrificial layer (e.g., a sacrificial polysilicon layer, a sacrificial amorphous silicon layer or other suitable sacrificial layer) can be formed above and adjacent to the opposing sides of each semiconductor body 210. A second sacrificial layer (e.g., a sacrificial nitride layer), which is different from the first sacrificial layer, can be formed on the top surface of the first sacrificial layer. The first and second sacrificial layers can then be patterned and etched to form sacrificial gates 231 (also referred to herein as dummy gates), wherein each sacrificial gate 231 is positioned above the top surfaces and adjacent to the opposing sides of the semiconductor bodies at adjacent channel regions and wherein each sacrificial gate 231 has a sacrificial cap 232 (see FIGS. 2A-2B).

Figure 3:
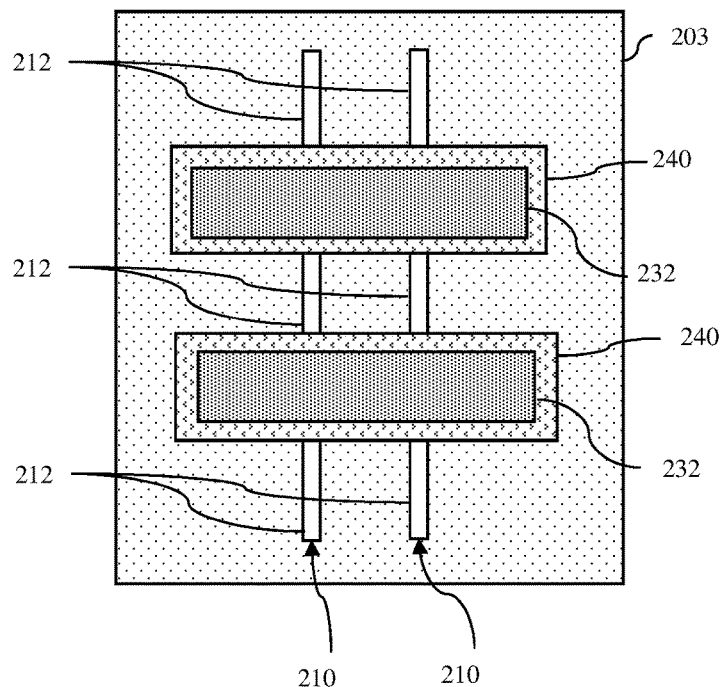
FIG. 3 is a top view diagram illustrating a partially completed structure formed according to the methods of FIG. 1.

Next, gate sidewall spacers 240 can be formed on the sidewalls of the sacrificial gates 231 (see FIG. 3). That is, a relatively thin conformal dielectric layer (e.g., a silicon nitride layer, a silicon carbon nitride layer, a silicon boron carbon nitride layer or other suitable conformal dielectric layer) can be deposited over the partially completed structure. Then, a directional etch process can be performed so as to remove the conformal dielectric layer from horizontal surfaces and from the sidewalls of the semiconductor bodies 210 at the source/drain regions 212. Those skilled in the art will recognize that the height of the sacrificial cap 232 on the sacrificial gates 231 should be approximately equal to or greater than the height of the semiconductor bodies 210 so that the conformal dielectric layer can be removed from the sidewalls of the semiconductor bodies 210 at the source/drain regions 212 without exposing the sidewalls of the sacrificial gates 231.

Figure 4:
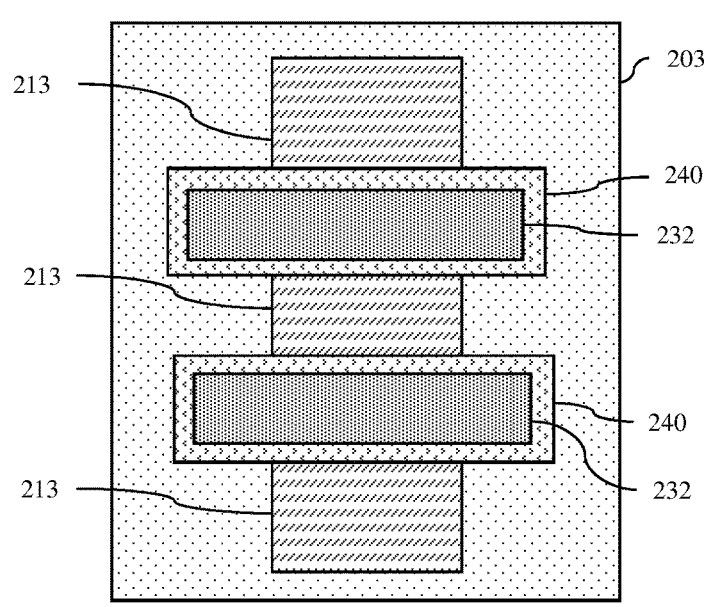
FIG. 4 is a top view diagram illustrating a partially completed structure formed according to the methods of FIG. 1.
Figure 5A:
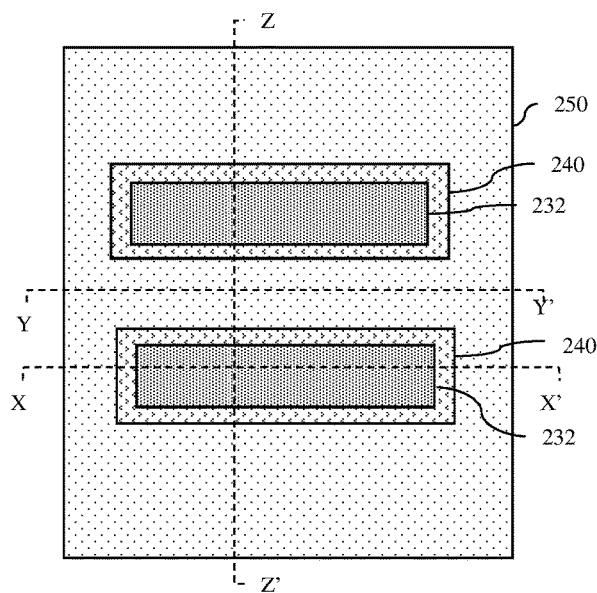
FIG. 5A is a top view diagram and FIGS. 5B-5D are different cross-section diagrams illustrating a partially completed structure formed according to the methods of FIG. 1.
Figure 5B:
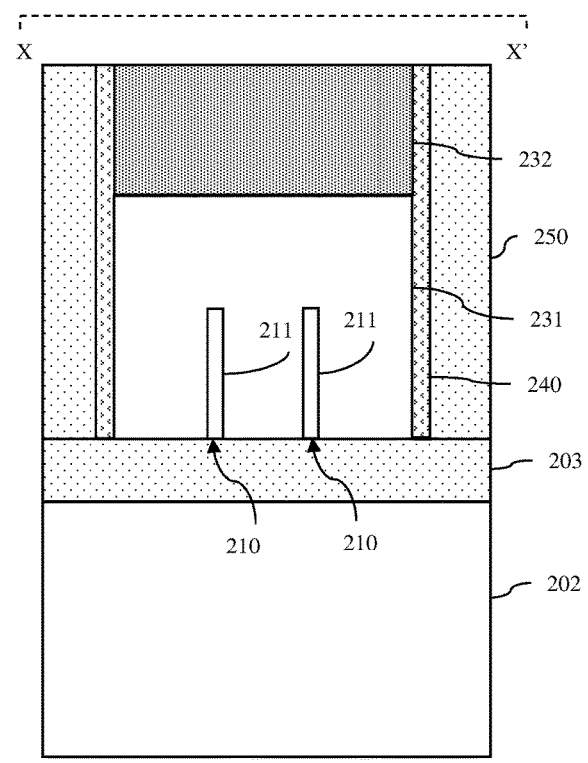
Figure 5C:
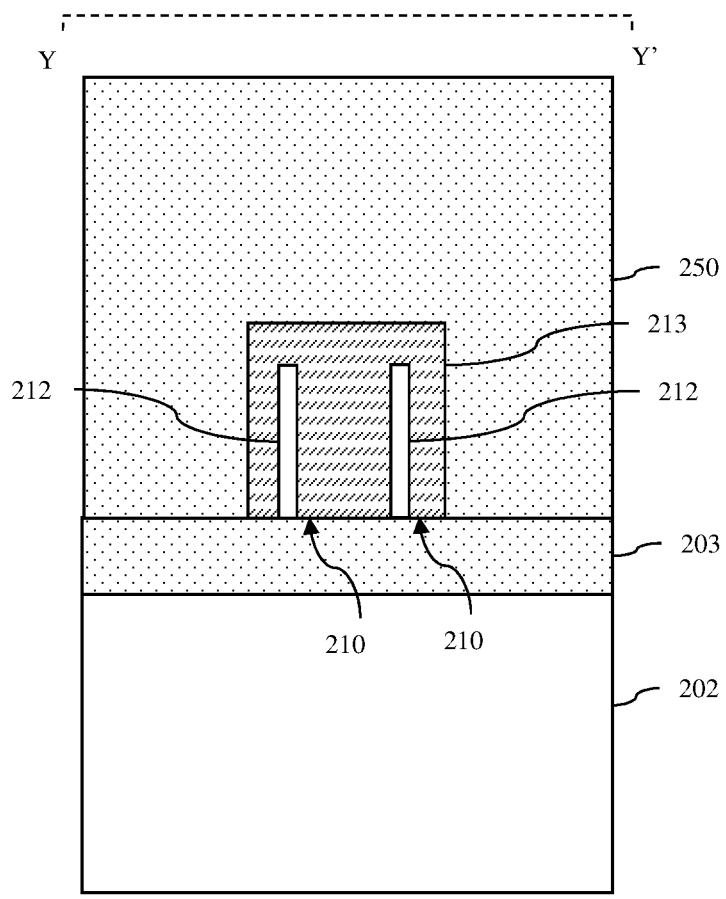
Figure 5D:
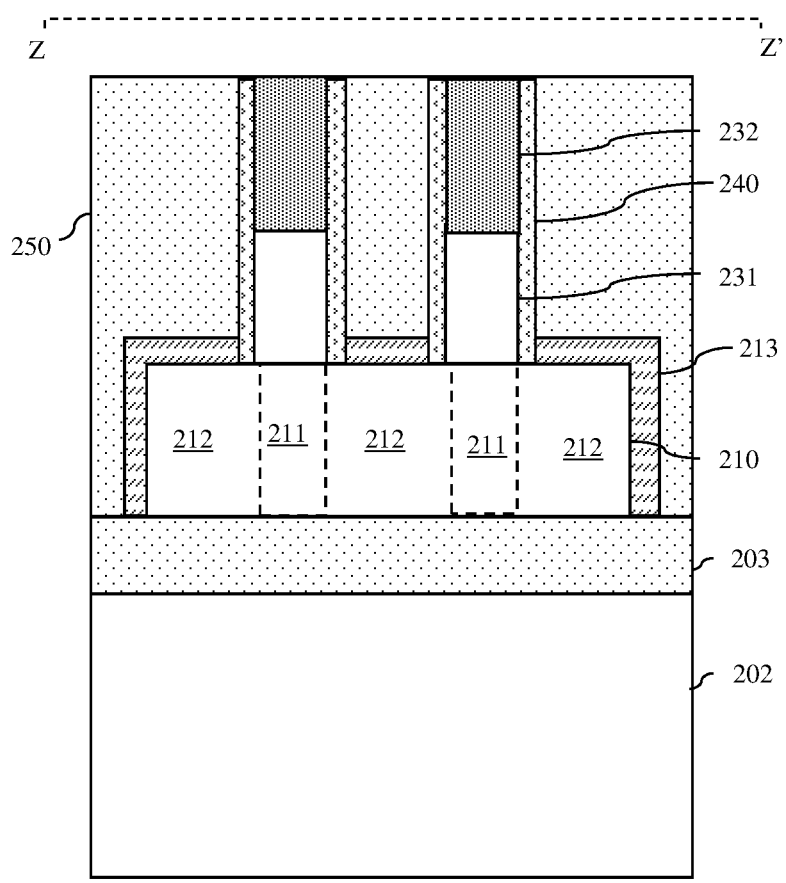

A dopant implantation process can subsequently be performed to dope the source/drain regions 212 with a second dopant so that the source/drain regions 212 have a second-type conductivity at a relatively high conductivity level. Additionally or alternatively, epitaxial semiconductor material (e.g., epitaxial silicon or any other suitable epitaxial semiconductor material) can be deposited on exposed portions of the semiconductor bodies 210 (i.e., on the source/drain regions 212) to form raised source/drain regions 213 (see FIG. 4). The epitaxial semiconductor material can be in-situ doped or subsequently implanted with the second dopant so that the source/drain regions 212 and the raised source/drain regions 213 have the second-type conductivity at the relatively high conductivity level. Optionally, before depositing the epitaxial semiconductor material, as described above, the source/drain regions 212 can be recessed (not shown), thereby ensuring that the source/drain regions 212 and the epitaxial source/drain regions 213 will be properly doped. If present, each raised source/drain region 213 will be positioned laterally immediately adjacent to at least one gate sidewall spacer 240 opposite a sacrificial gate 231 and, optionally, the epitaxial semiconductor material on adjacent source/drain regions 212 will be merged into a single region, as illustrated.

Figure 6A:
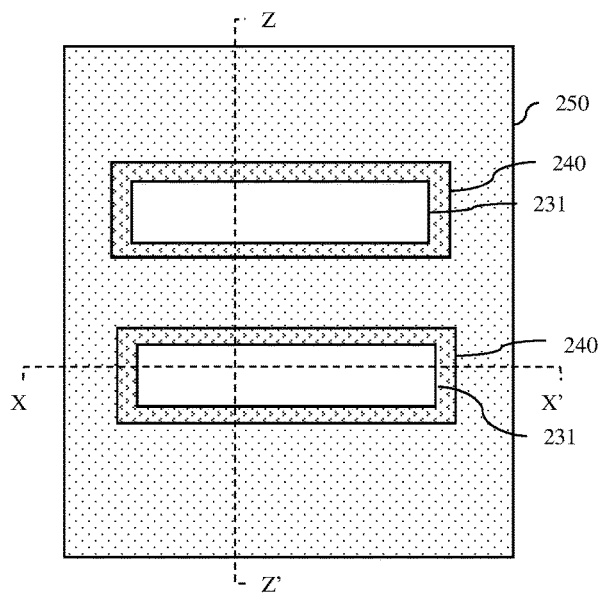
FIG. 6A is a top view diagram and FIGS. 6B-6C are different cross-section diagrams illustrating a partially completed structure formed according to the methods of FIG. 1.
Figure 6B:
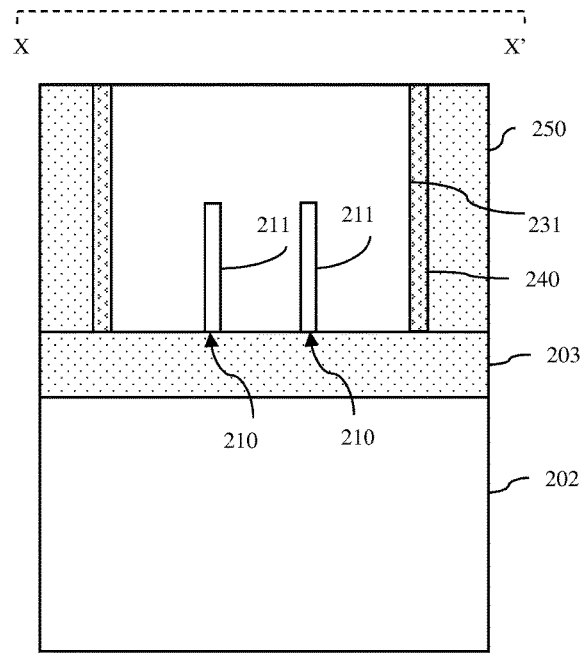
Figure 6C:
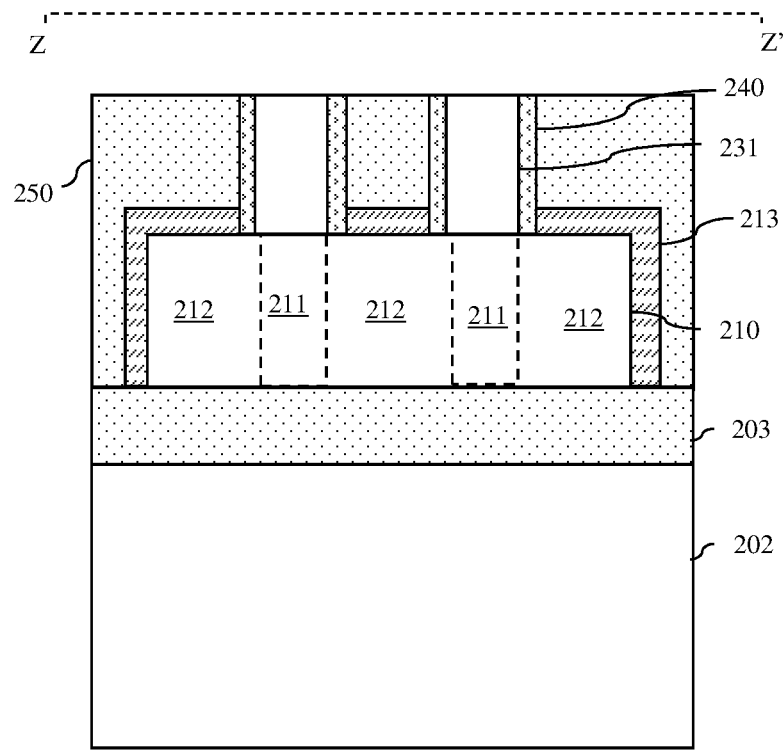

Next, a first interlayer dielectric (ILD) layer 250 can be formed over the partially completed structure and then planarized (see FIGS. 5A-5D). Specifically, a blanket first ILD dielectric layer 250 (e.g., a blanket silicon oxide layer or other suitable blanket ILD layer) can be deposited so as to cover the sacrificial caps 232 and gate sidewall spacers 240 on each sacrificial gate 231 as well as over each source/drain region 212 (or raised source/drain region 213, if applicable). A chemical mechanical polishing (CMP) process can then be performed in order to expose the top surfaces of the sacrificial gates 231 and the gate sidewall spacers 240 (see FIGS. 6A-6C). Optionally, before this CMP process is performed to expose the top surfaces of the sacrificial gates 231 and the gate sidewall spacers 240, a CMP process can be performed to expose the sacrificial caps 232 above the sacrificial gates 231 and the first ILD layer 250 can be recessed. In this case, the removed ILD material can be replaced with a material that is generally the same but with a different density (e.g., a greater density), which is more suitable for use with the CMP process that exposes the sacrificial gates.

Figure 7A:
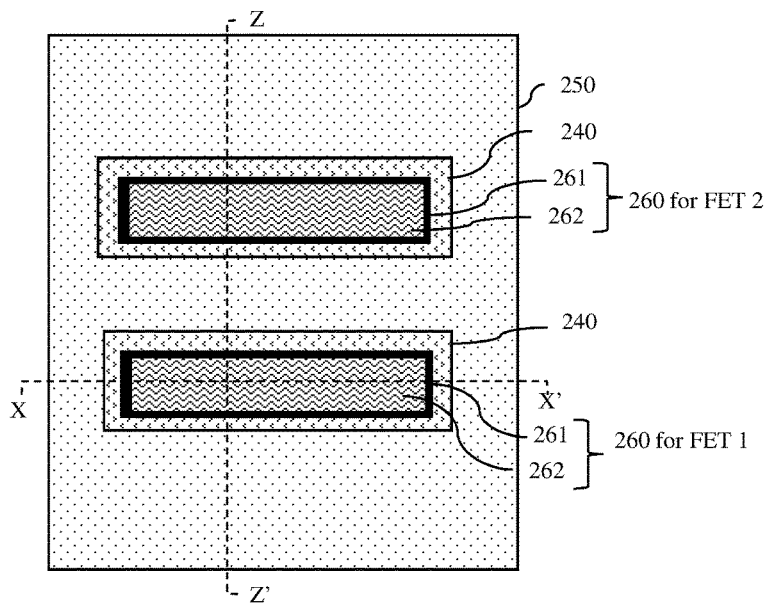
FIG. 7A is a top view diagram and FIGS. 7B-7C are different cross-section diagrams illustrating a partially completed structure formed according to the methods of FIG. 1.
Figure 7B:
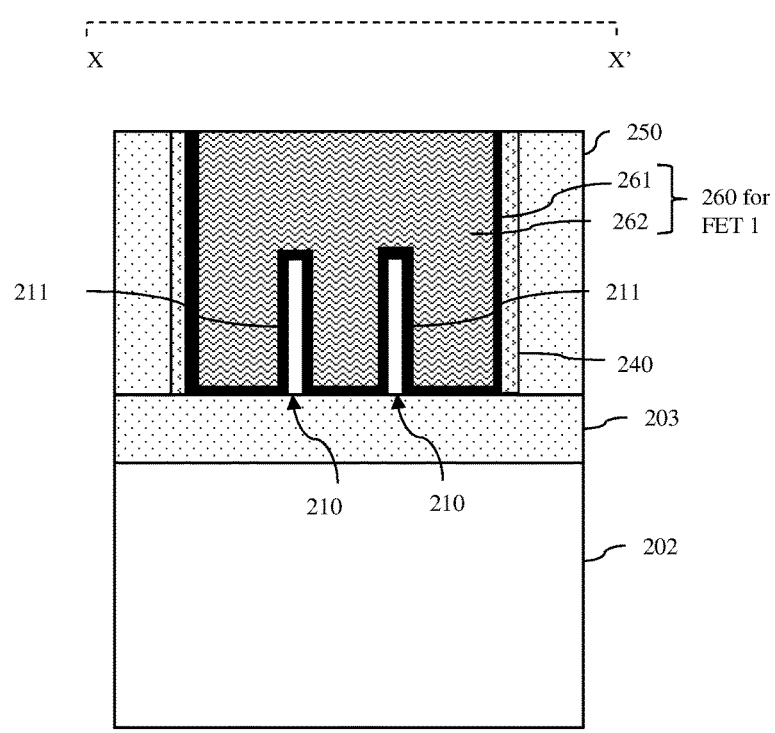
Figure 7C:
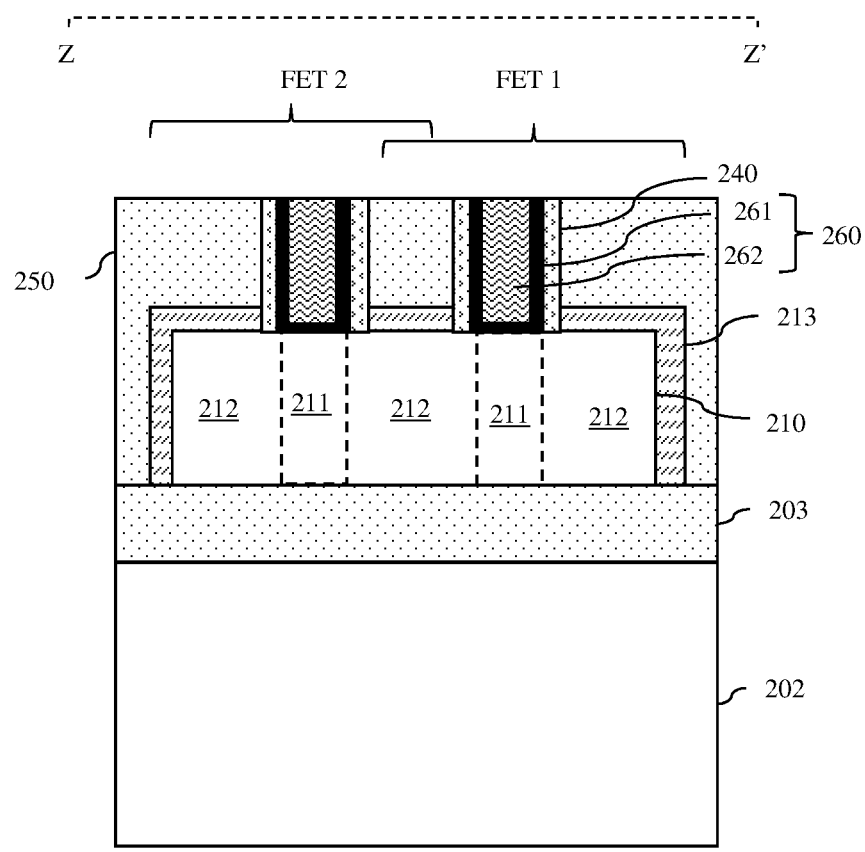

Once the top surfaces of the sacrificial gates 231 and the gate sidewall spacers 240 are exposed, the sacrificial gates 231 can be selectively removed and replaced with replacement metal gates 260 for a pair of adjacent non-planar FETs 1 and 2 (see FIGS. 7A-7C). Specifically, the sacrificial material of the sacrificial gates 231 can be selectively etched over the dielectric materials used for the gate sidewall spacers 240 and the first ILD layer 250, thereby creating gate openings in the first ILD layer 250. The gate openings will have sidewalls lined with the gate sidewall spacers 240. Replacement metal gates 260 for each non-planar FET can be formed in each gate opening by depositing a conformal high-K gate dielectric layer 261 so as to line the gate openings and by further depositing one or more metal layers 262 onto the gate dielectric layer 261. Those skilled in the art will recognize that the materials and thicknesses of the dielectric and metal layers used for the replacement metal gates can be preselected to achieve desired work functions given the conductivity type of the FET. In any case, another chemical mechanical polishing (CMP) process can be performed to remove all gate materials from above the top surface of the first ILD layer 250.

Figure 8A:
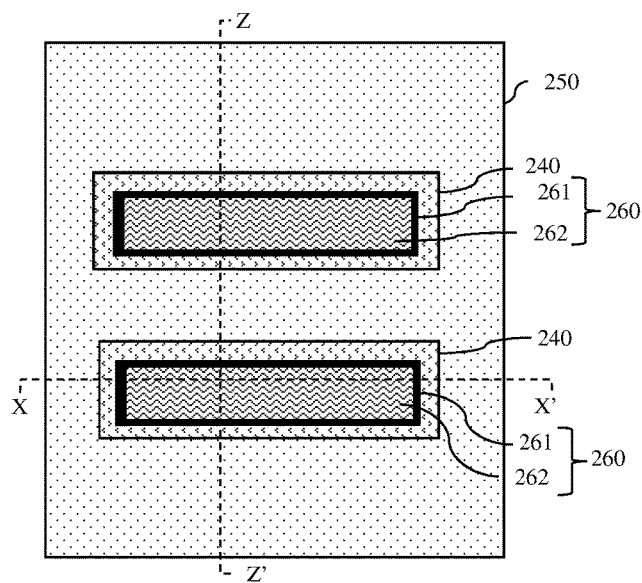
FIG. 8A is a top view diagram and FIGS. 8B-8C are different cross-section diagrams illustrating a partially completed structure formed according to the methods of FIG. 1.
Figure 8B:
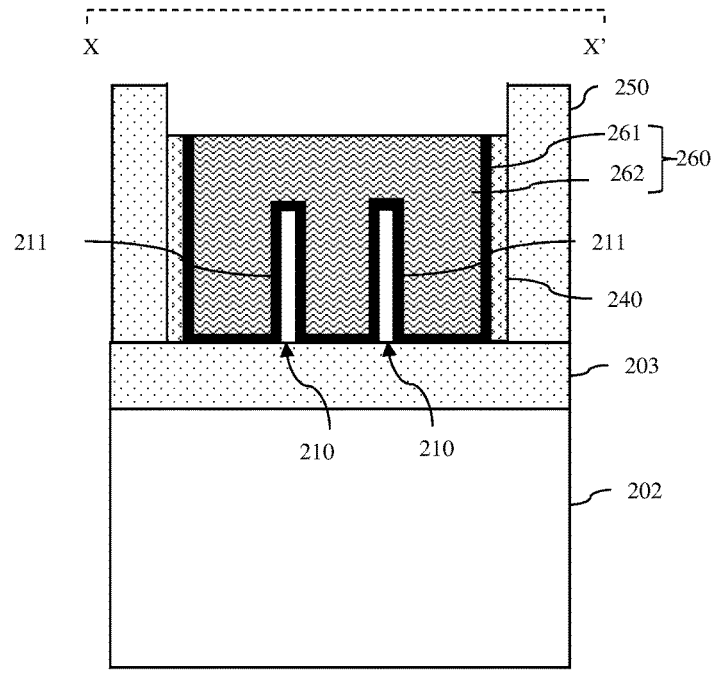
Figure 8C:
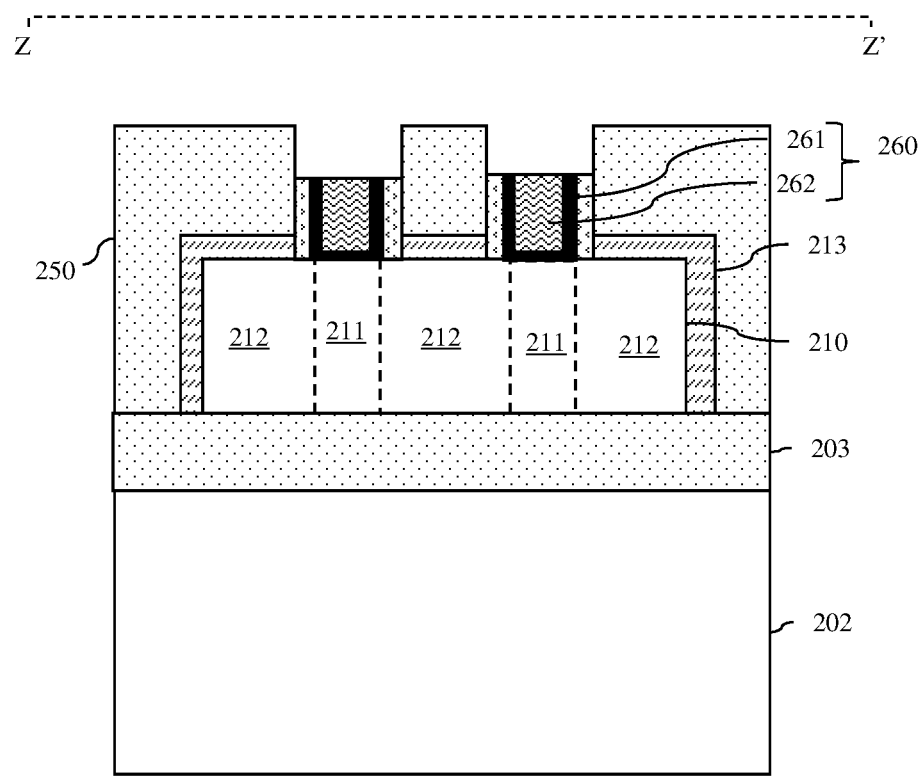

The replacement metal gates 260 and the adjacent gate sidewall spacers 240 can then be recessed so that the top surfaces of these features are below the level of the top surface of the first ILD layer 250 and so that vertical surfaces of the first ILD layer 250 are exposed (104, see FIGS. 8A-8C). Those skilled in the art will recognize that the process 104 of recessing the replacement metals and adjacent gate sidewall spacers can include discrete etch processes. For example, a first selective etch process can be performed to recess the replacement metal gate(s) and a second selective etch process can be performed to recess the gate sidewall spacer(s).

Figure 9A:
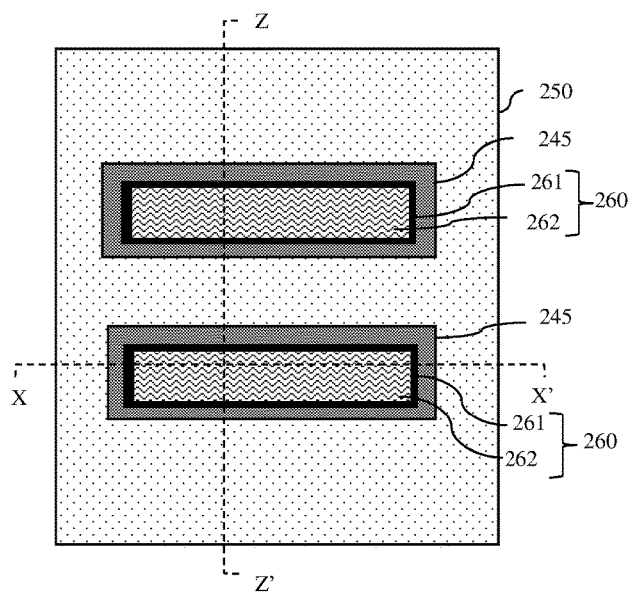
FIG. 9A is a top view diagram and FIGS. 9B-9C are different cross-section diagrams illustrating a partially completed structure formed according to the methods of FIG. 1.
Figure 9B:
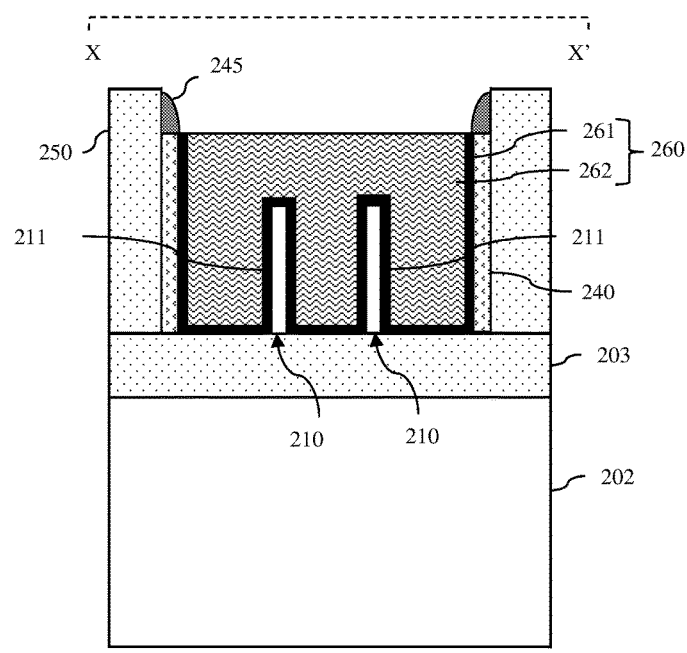
Figure 9C:
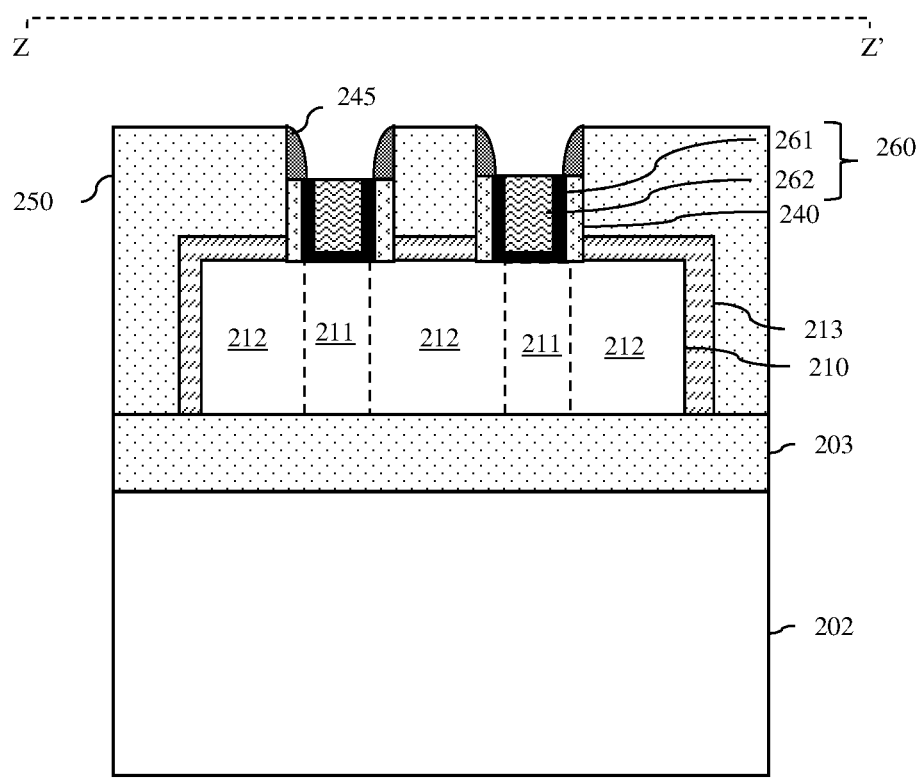

Next, dielectric spacers 245 can be formed on exposed vertical surfaces of the first ILD layer 250 above each gate sidewall spacer 240 (106, see FIGS. 9A-9C). That is, a relatively thin conformal dielectric layer (e.g., a silicon oxycarbide layer or other suitable conformal dielectric layer, as discussed in greater detail below) can be deposited over the partially completed structure. Then, a directional etch process can be performed so as to remove the conformal dielectric layer from horizontal surfaces, thereby leaving dielectric spacers 245 on the exposed vertical surfaces of the first ILD 250 above the gate sidewall spacers 240, respectively.

Figure 10A:
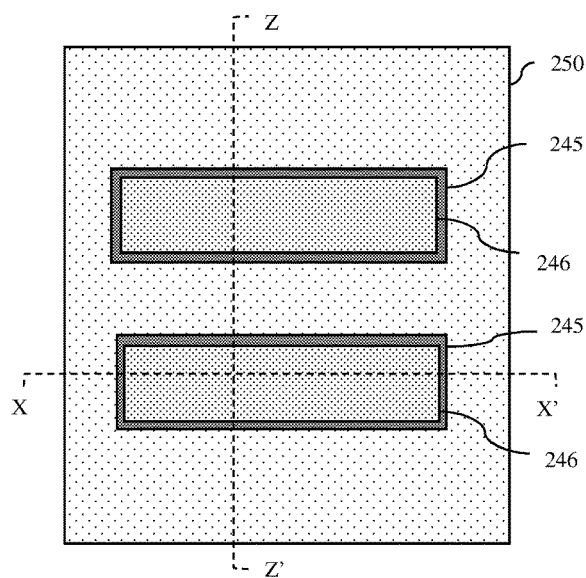
FIG. 10A is a top view diagram and FIGS. 10B-10C are different cross-section diagrams illustrating a partially completed structure formed according to the methods of FIG. 1.
Figure 10B:
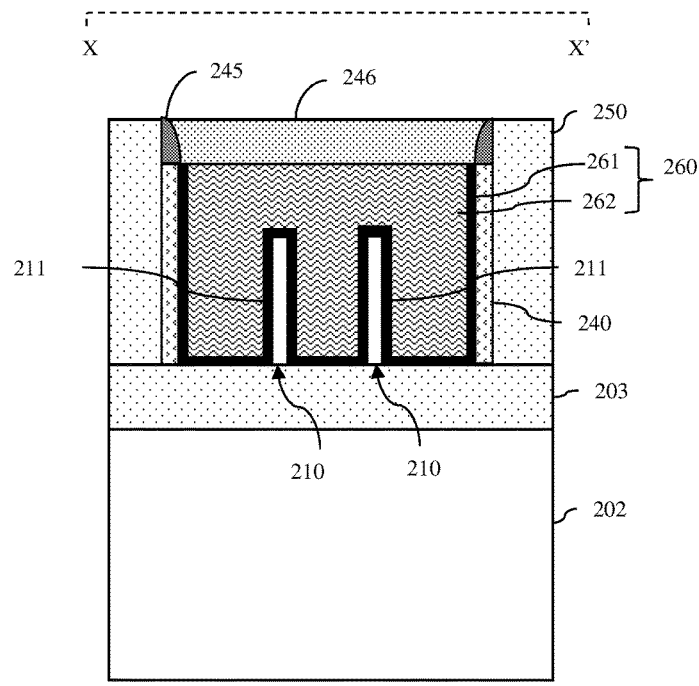
Figure 10C:
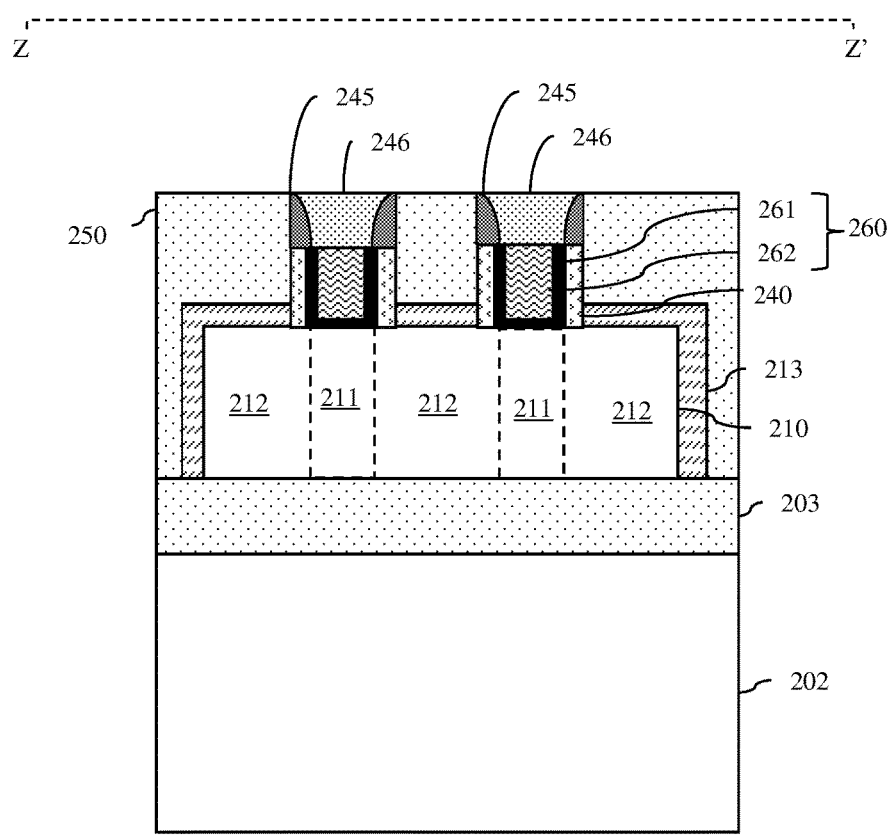

After dielectric spacer formation at process 106, dielectric caps 246 can be formed on the replacement metal gates 260 such that each dielectric cap is laterally surrounded by and immediately adjacent to a dielectric spacer 245 (108, see FIGS. 10A-10C). Specifically, a dielectric cap layer can be deposited so as to fill the spaces above each recessed replacement metal gate 260 and laterally surrounded by the dielectric spacers 245 and a CMP process can be performed, thereby forming the dielectric caps 246 on the replacement metal gates 260. The dielectric caps 246 can be made of the same dielectric material as the gate sidewall spacers 240. For example, both the dielectric cap 246 and the gate sidewall spacer 240 could be made of silicon nitride. Alternatively, the dielectric caps 246 and gate sidewall spacers 240 could be made of different dielectric materials. For example, the gate sidewall spacers 240 could be made of silicon boron carbon nitride and the dielectric caps 246 could be made of silicon nitride. In any case, the dielectric caps 246 should be made of a different dielectric material than the dielectric spacers 245 and the first ILD layer 250.

Figure 11A:
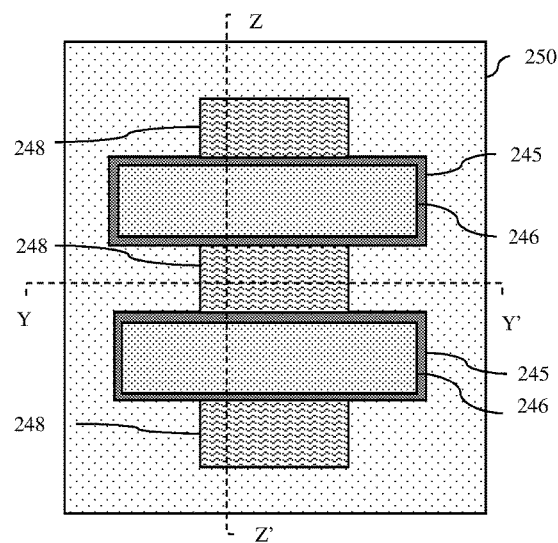
FIG. 11A is a top view diagram and FIGS. 11B-11C are different cross-section diagrams illustrating a partially completed structure formed according to the methods of FIG. 1.
Figure 11B:
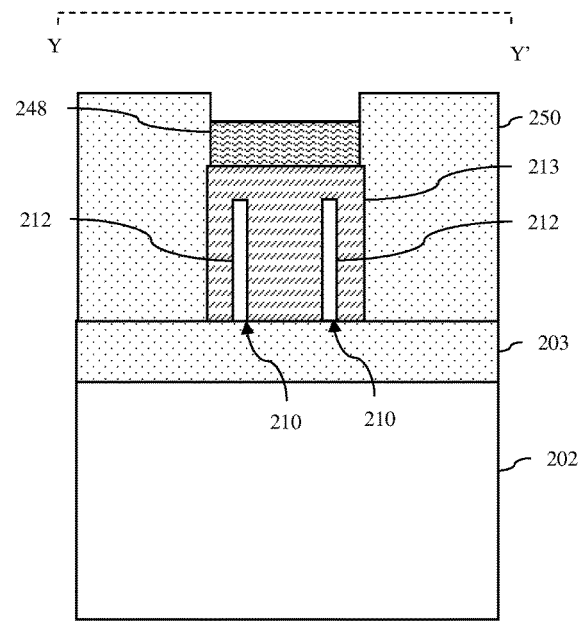
Figure 11C:
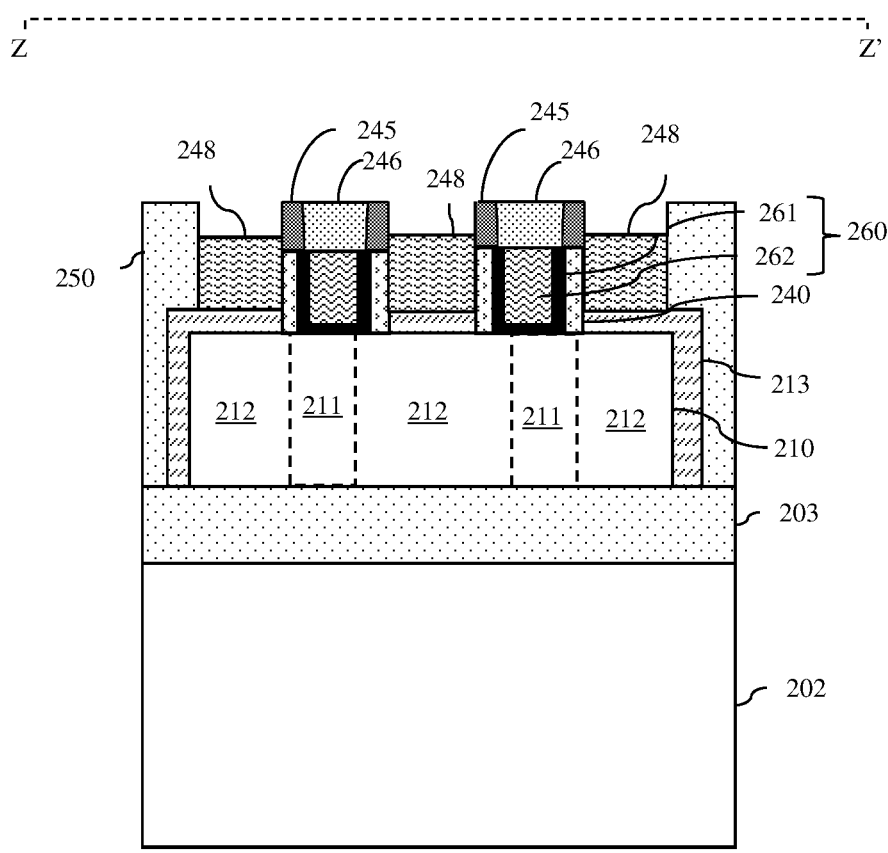
Figure 12A:
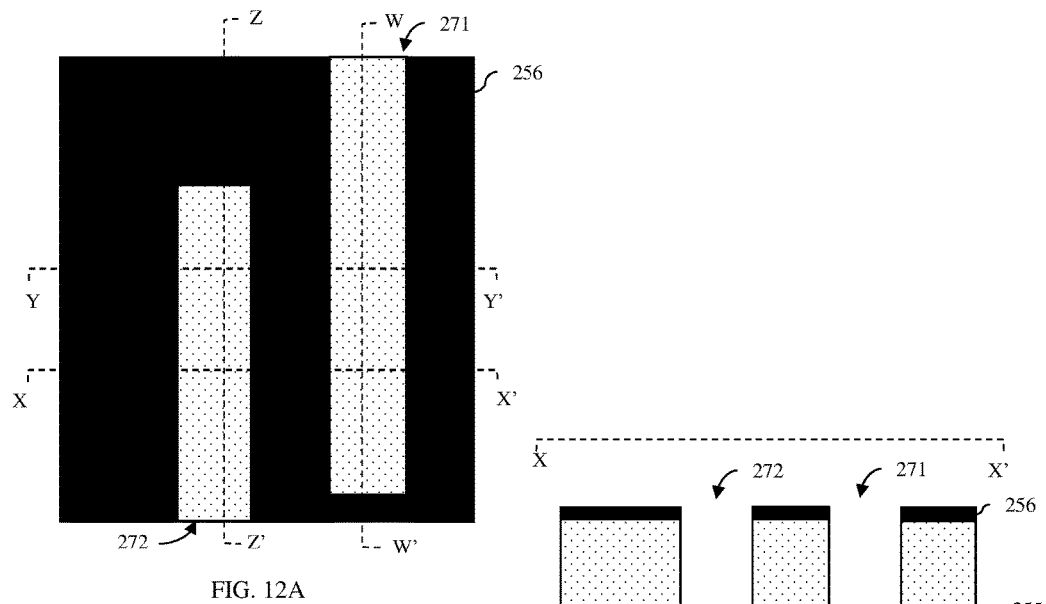
FIG. 12A is a top view diagram and FIGS. 12B-12E are different cross-section diagrams illustrating a partially completed structure formed according to the methods of FIG. 1.
Figure 12B:
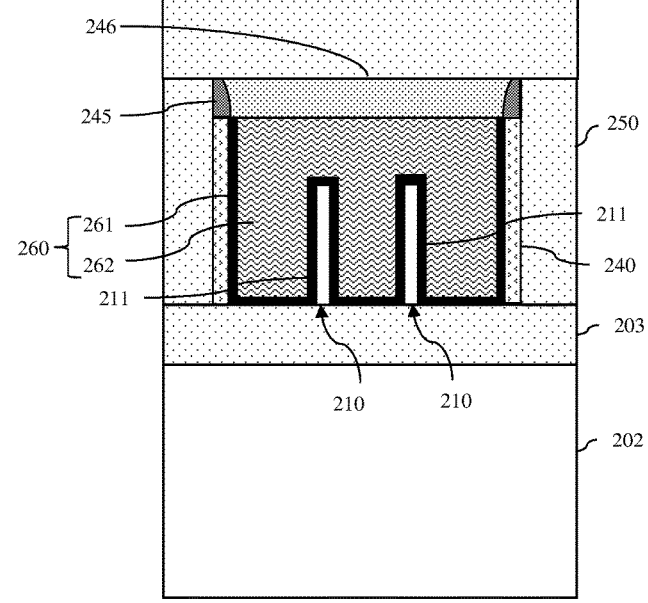
Figure 12C:
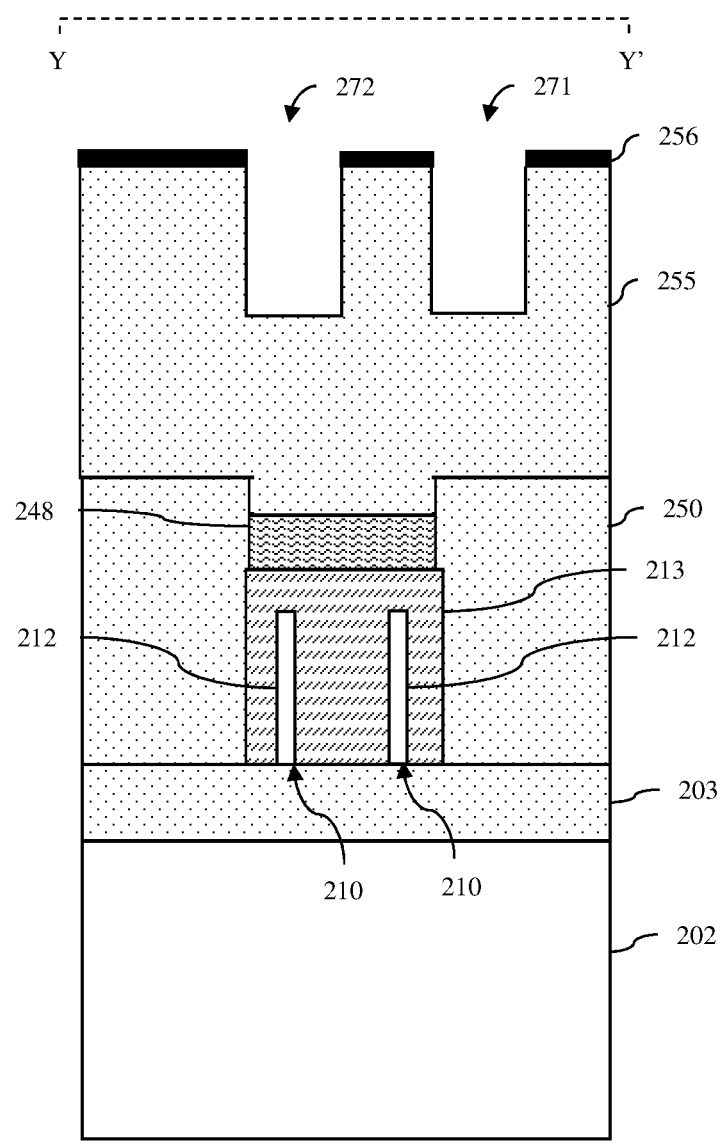
Figure 12D:
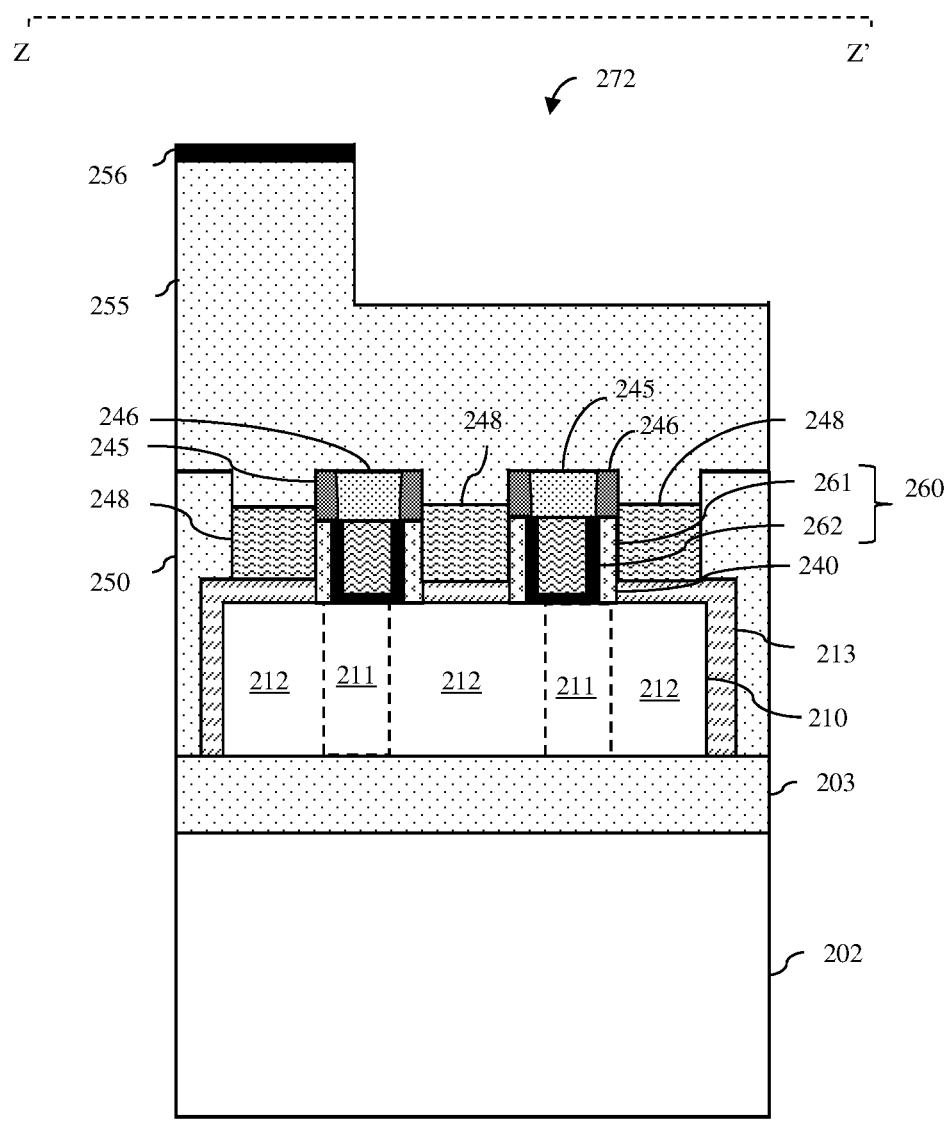
Figure 12E:
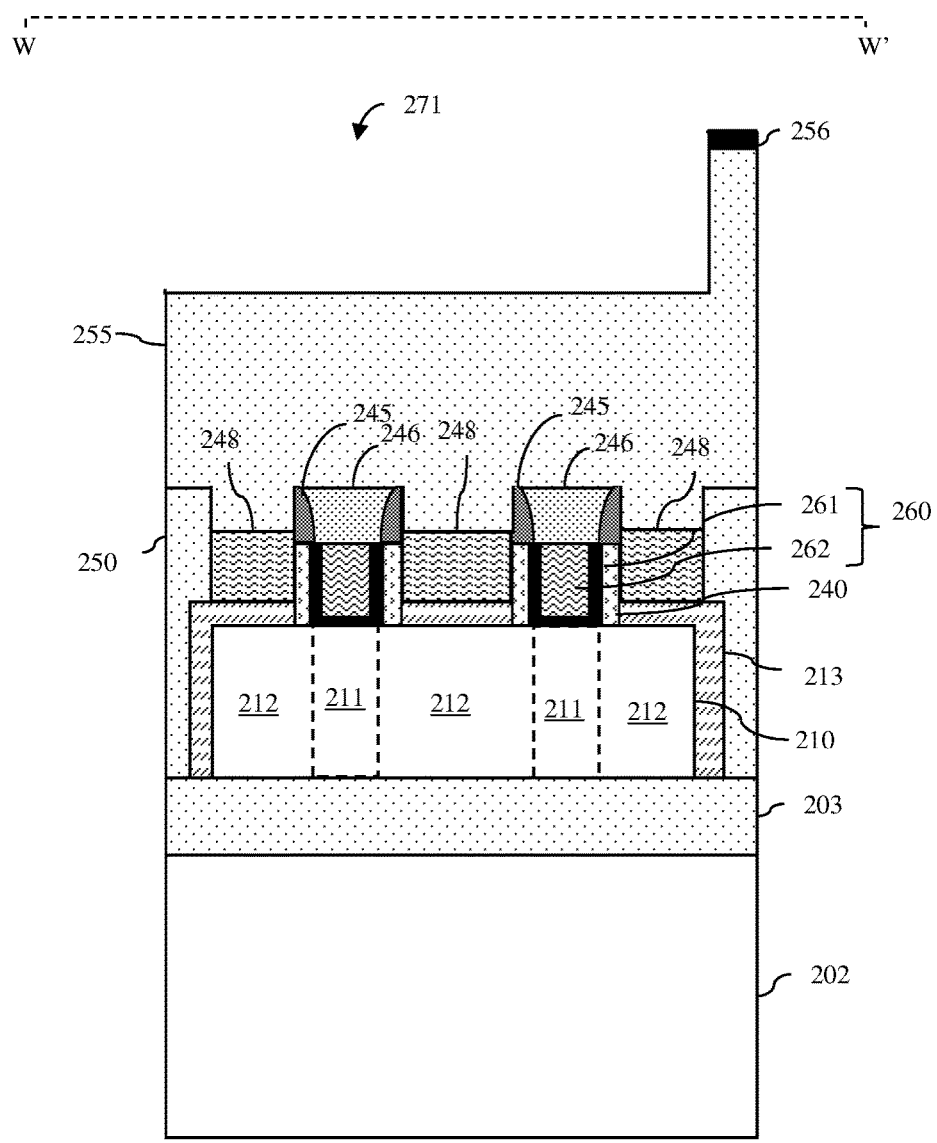

Additionally, recessed metal plugs 248 can be formed in the first ILD layer 250 on and, particularly, above and immediately adjacent to the source/drain regions 212 (or, if applicable, above and immediately adjacent to the raised first source/drain regions 213, as illustrated) (110, see FIGS. 11A-11C). To form the recessed metal plugs 248 at process 110, metal plug openings can be formed (e.g., lithographically patterned and etched) through the first ILD layer 250 to the source/drain regions 212 (or, if applicable, to the raised first source/drain regions 213, as illustrated). Then, metal plugs can be formed in the metal plug openings. That is, metal (e.g., a tungsten, cobalt, aluminum or any other suitable metal material) can be deposited into the metal plug openings and a CMP process can be performed to remove the metal from above the top surfaces of the first ILD layer 250. Additionally, an etch process can be performed to recess the metal within the metal plugs openings, thereby forming the recessed metal plugs 248. It should be noted that this etch process can be performed so that the top surfaces of the recessed metal plugs 248 are level with, lower than, or higher than the top surfaces of the replacement metal gates 260.

To complete the IC structure, both middle of the line (MOL) contacts and back end of the line (BEOL) metal levels can subsequently be formed. Specifically, a stack of dielectric layers 255-256 can be deposited over the partially completed structure and trenches (e.g., see trenches 271-272) for wires and/or vias (not shown) in the first back end of the line (BEOL) metal level (referred to herein as M0) can be formed in an upper portion of the stack (114-116, see FIGS. 12A-12E). Specifically, at process 114, a blanket second interlayer dielectric (ILD) layer 255 (e.g., a silicon dioxide layer or other suitable ILD layer) can be deposited so that it covers the dielectric caps 246 on the replacement metal gates 260, so that it covers the dielectric spacers 245 on the gate sidewall spacers 240, and so that it fills the spaces within the first ILD layer 250 above each recessed metal plug 248. A CMP process can then be performed to level the top surface of the second ILD layer 255 and a hardmask layer 256 (e.g., a titanium nitride hardmask layer or other suitable hardmask layer) can be formed on the second ILD layer 255. Then, conventional lithographic patterning and etch processes can be used to form a pattern of shapes corresponding to the desired trenches in the hardmask layer 256 and to then transfer the pattern into the upper portion of the second ILD layer 255, thereby forming the trenches 271-272.

Following trench formation at process 116, contact openings, which extend from the trenches through a lower portion of the stack, can be formed (118, see FIGS. 13A-13C and 14A-14C). Formation of the contact openings is described in greater detail below and illustrated in the Figures with respect to formation of a first contact opening 281 from a first trench 271 to one of the replacement metal gates 260 and formation of a second contact opening 286 from a second trench 272 to one of the metal plugs 248. Specifically, a first contact opening 281 can be formed such that it extends from a first trench 271 through the lower portion of the stack and through the dielectric cap 246 to a replacement metal gate 260 (119, see FIGS. 13A-13C). For example, a first optical polymerization layer (OPL) 280 can be deposited onto the hardmask layer 256 and into the trenches 271-272. This first OPL 280 can be lithographically patterned with a first contact opening 281 and selective directional etch processes can be performed to extend the first contact opening 281 from the first trench 271 through the lower portion of the second ILD layer 255 to the dielectric cap 246 and then through the dielectric cap 246 to the replacement metal gate 260. Optionally, this first contact opening 281 can land on the replacement metal gate 260 above an active region (or close thereto), as opposed to being aligned above an isolation region. Additionally, a second contact opening 286 can be formed such that it extends from a second trench 272 through the lower portion of the stack to a metal plug 248 (120, see FIGS. 14A-14C). For example, the first OPL 280 can be selectively removed and a second optical polymerization layer (OPL) layer 285 can be deposited onto the hardmask layer 256 and into the trenches 271-272. This second OPL 285 can be lithographically patterned with a second contact opening 286 and a directional etch process can be performed to extend the second contact opening 286 from the second trench 272 through the lower portion of the second ILD layer 255 to a metal plug 248. While formation of the contact openings is described above and illustrated in the Figures with respect to formation of a first contact opening from a first trench to a replacement metal gate and formation of a second contact opening from a second trench to a metal plug, it should be understood that multiple first contact openings (e.g., to the same replacement metal gate or to another replacement metal gate) may be simultaneously formed and, similarly, multiple second contact openings (e.g., contact openings to the other metal plugs) may also be simultaneously formed.

After the trenches and contact openings are formed, metal can be deposited to form BEOL metal wires and/or vias (not shown) in the trenches and to form contacts in the contact openings (122, see FIGS. 15A-15D). The metal deposited at process 122 can be, for example, copper, aluminum or any other metal material suitable for BEOL metal level wire and/or via formation. Various different techniques for depositing metal to fill trenches and contacts openings are well known in the art. Thus, the details of these techniques are omitted from this specification in order to allow the reader to focus on the salient aspect of the disclosed methods. Following metal deposition, yet another CMP process can be performed to remove metal and the remaining dielectric layer 256 (i.e., the hardmask layer) from above the dielectric layer 255. In any case, the resulting IC structure 200 shown in FIGS. 15A-15D, following metal deposition and CMP, will include at least: a first contact 293, which is within the first contact opening 281 and which extends from a first wire 291 in the first trench 271 to one of the replacement metal gates 260; and a second contact 294, which is in the second contact opening 281 and which extends from a second wire 292 in the second trench 272 to one of the metal plugs 248.

In this method embodiment, the dielectric caps 246 on the replacement metal gates 260, the dielectric spacers 245 laterally surrounding and immediately adjacent to the dielectric caps 246, and each of the dielectric layers 255, 256 in the stack are specifically made, during the various process steps, of different dielectric materials. For example, as mentioned above, the dielectric caps 246 on the replacement metal gates 260 could be made of silicon nitride, the dielectric spacers 245 laterally surrounding and immediately adjacent to the dielectric caps 246 could be made of silicon oxycarbide, the first and second ILD layers 250 and 255 could be made of silicon oxide and the hardmask layer 256 could be made of titanium nitride. Due to these different dielectric materials, the widths and lengths of the contact openings 281, 286 are limited and the contacts 293, 294 formed therein will be self-aligned in two different dimensions.

Figure 13A:
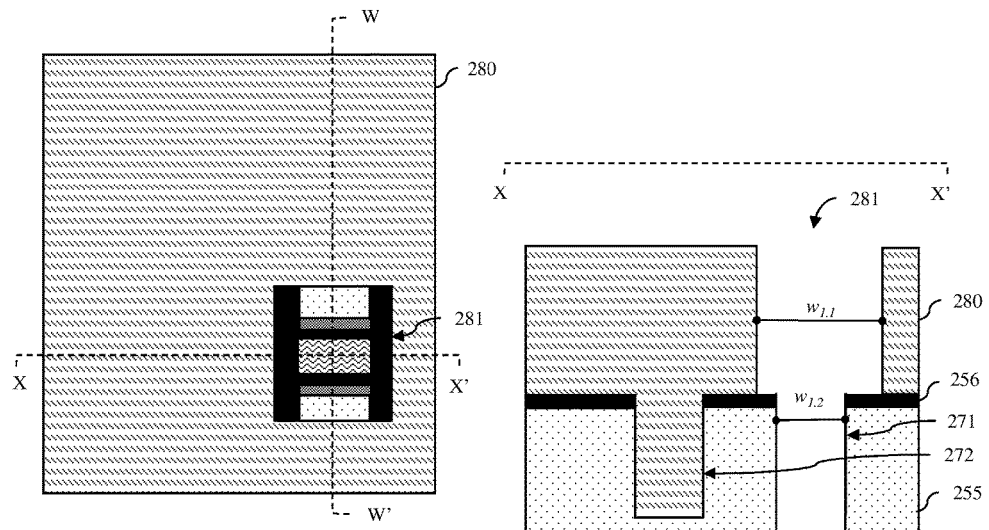
FIG. 13A is a top view diagram and FIGS. 13B-13C are different cross-section diagrams illustrating a partially completed structure formed according to the methods of FIG. 1.
Figure 13B:
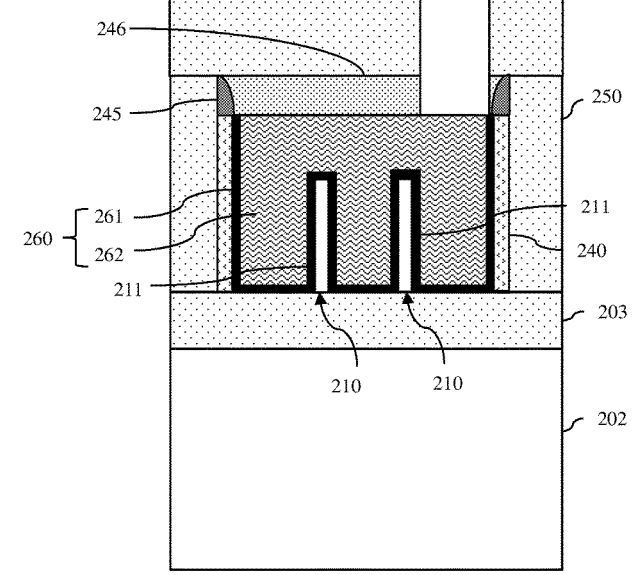
Figure 13C:
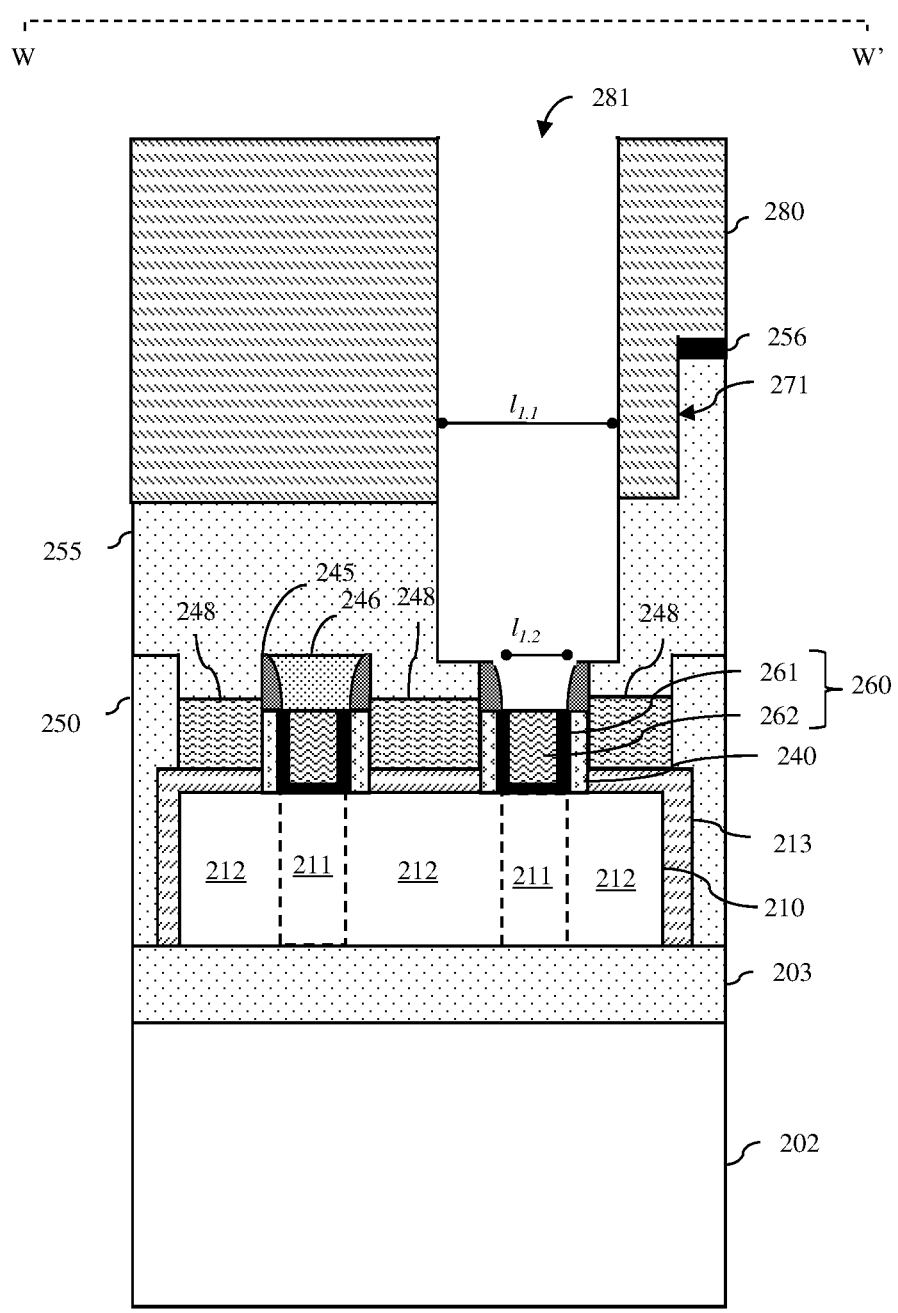
Figures 14A, 14B:
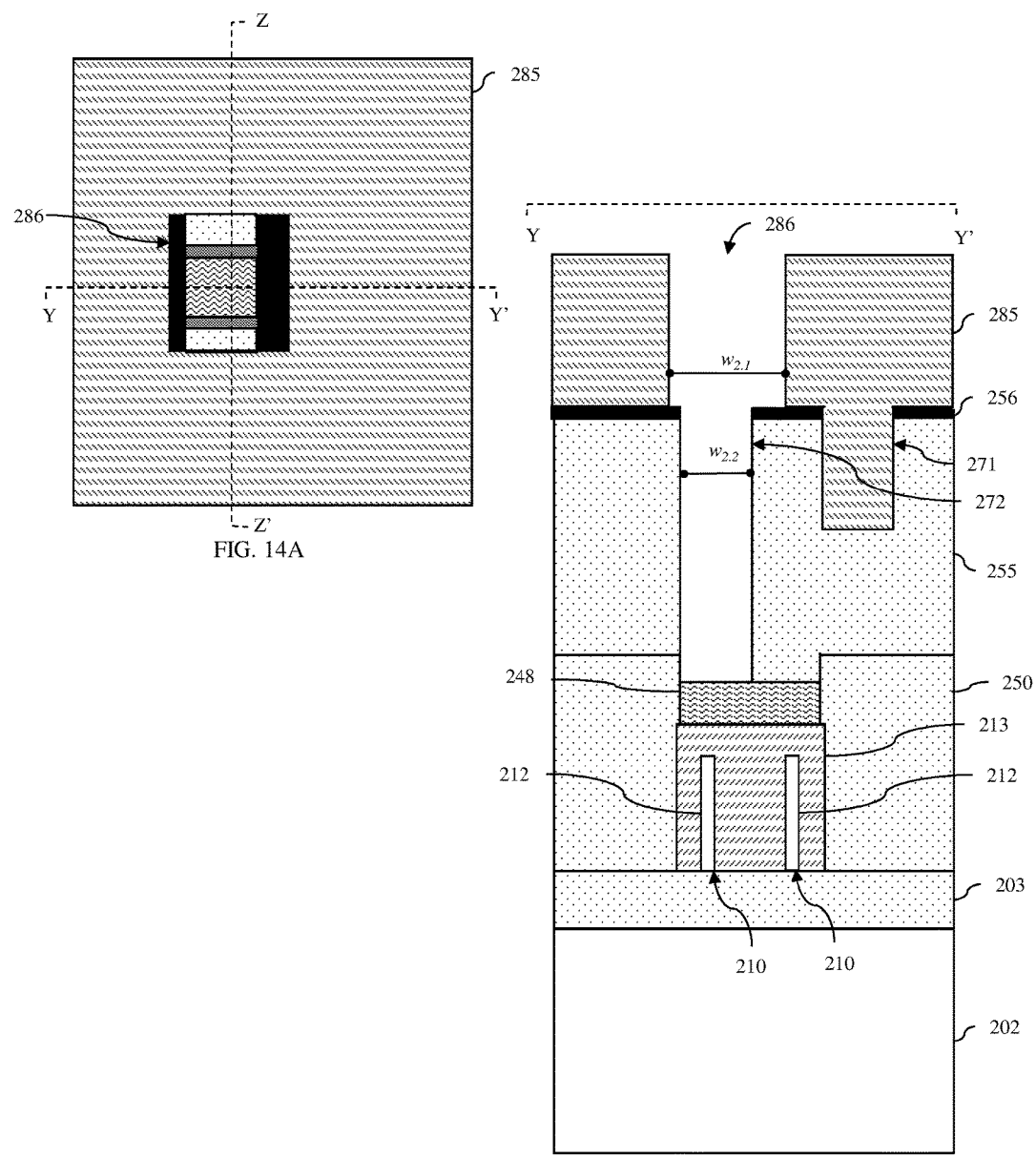
FIG. 14A is a top view diagram and FIGS. 14B-14C are different cross-section diagrams illustrating a partially completed structure formed according to the methods of FIG. 1.
Figure 14C:
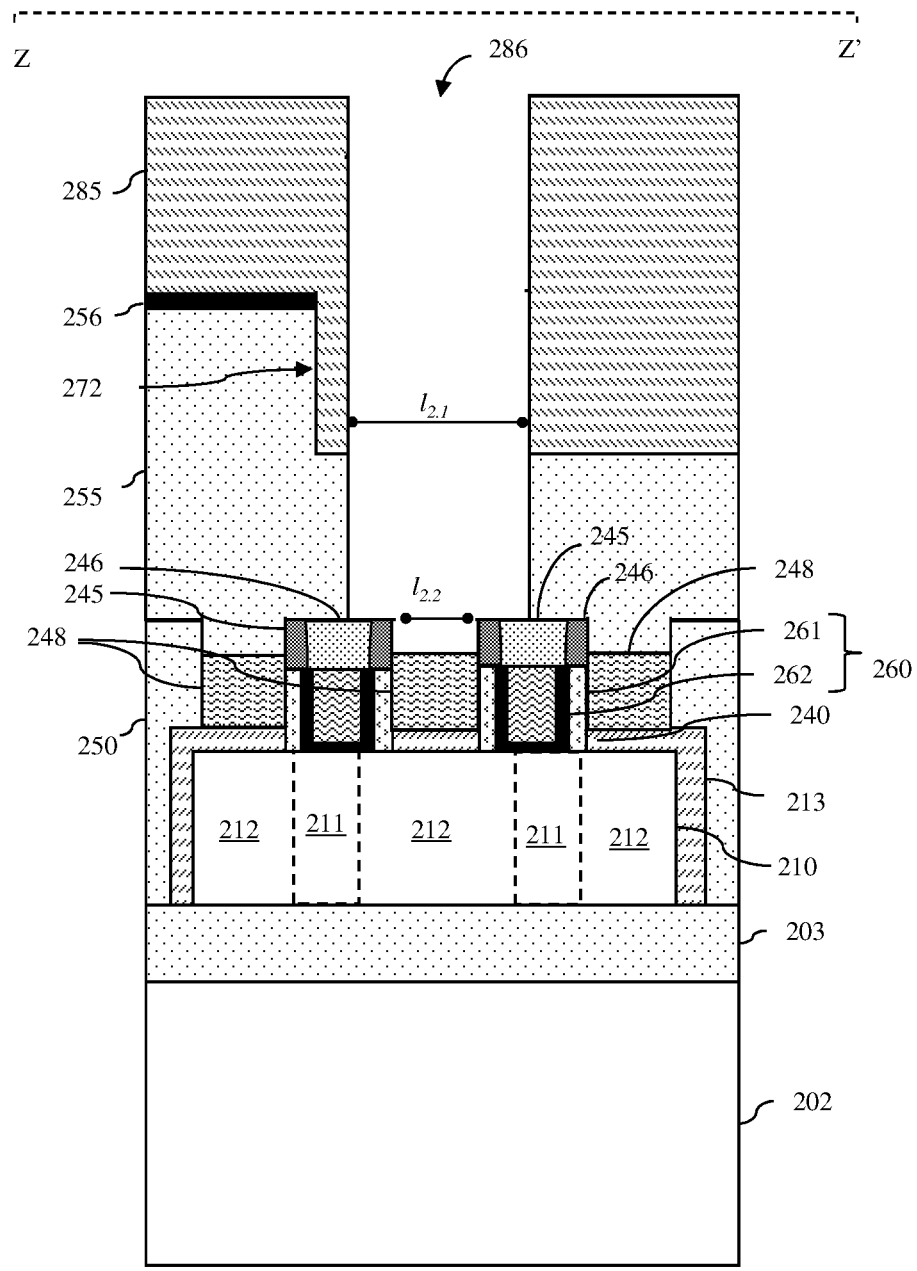
Figure 15A:
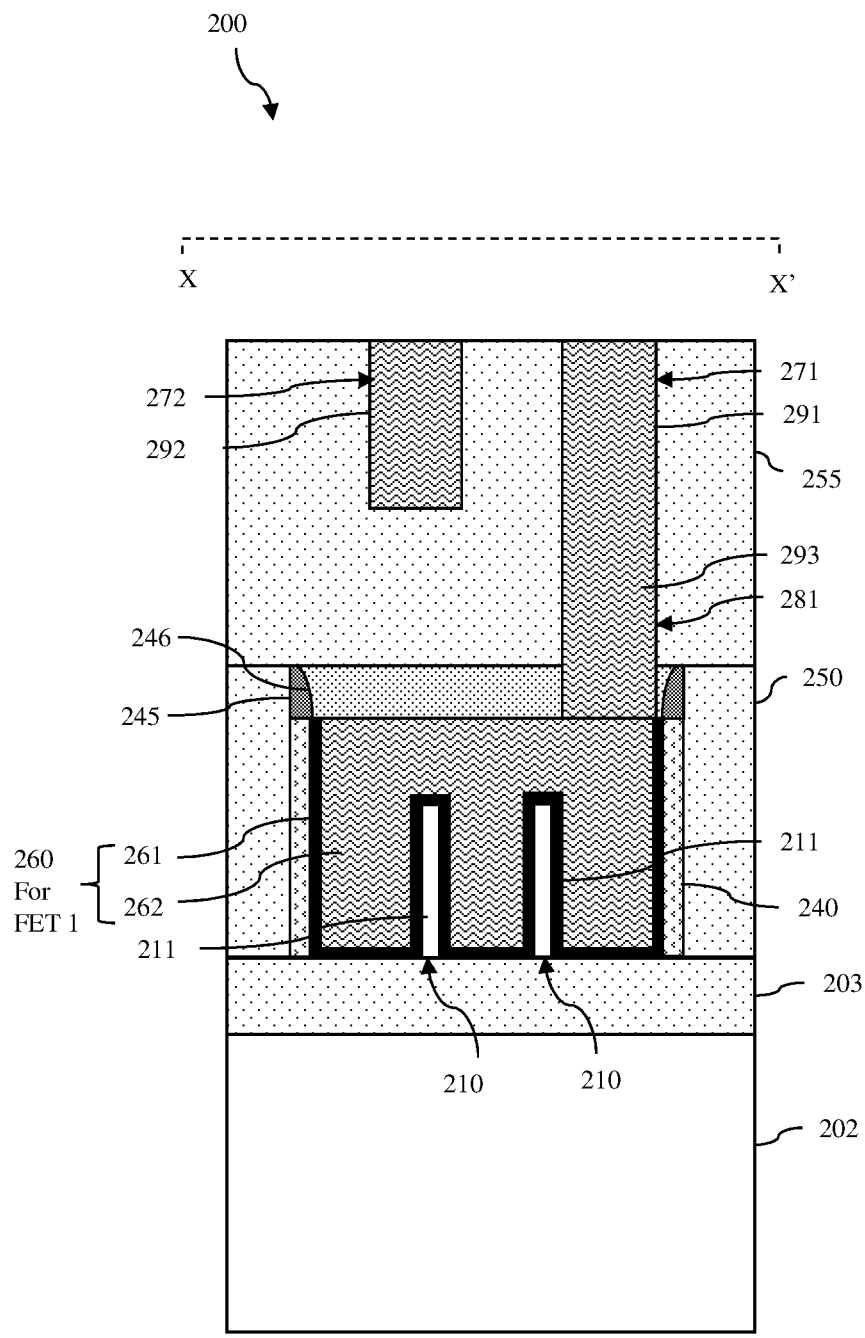
FIGS. 15A-15D are different cross-section diagrams illustrating completed structure formed according to the methods of FIG. 1.
Figure 15B:
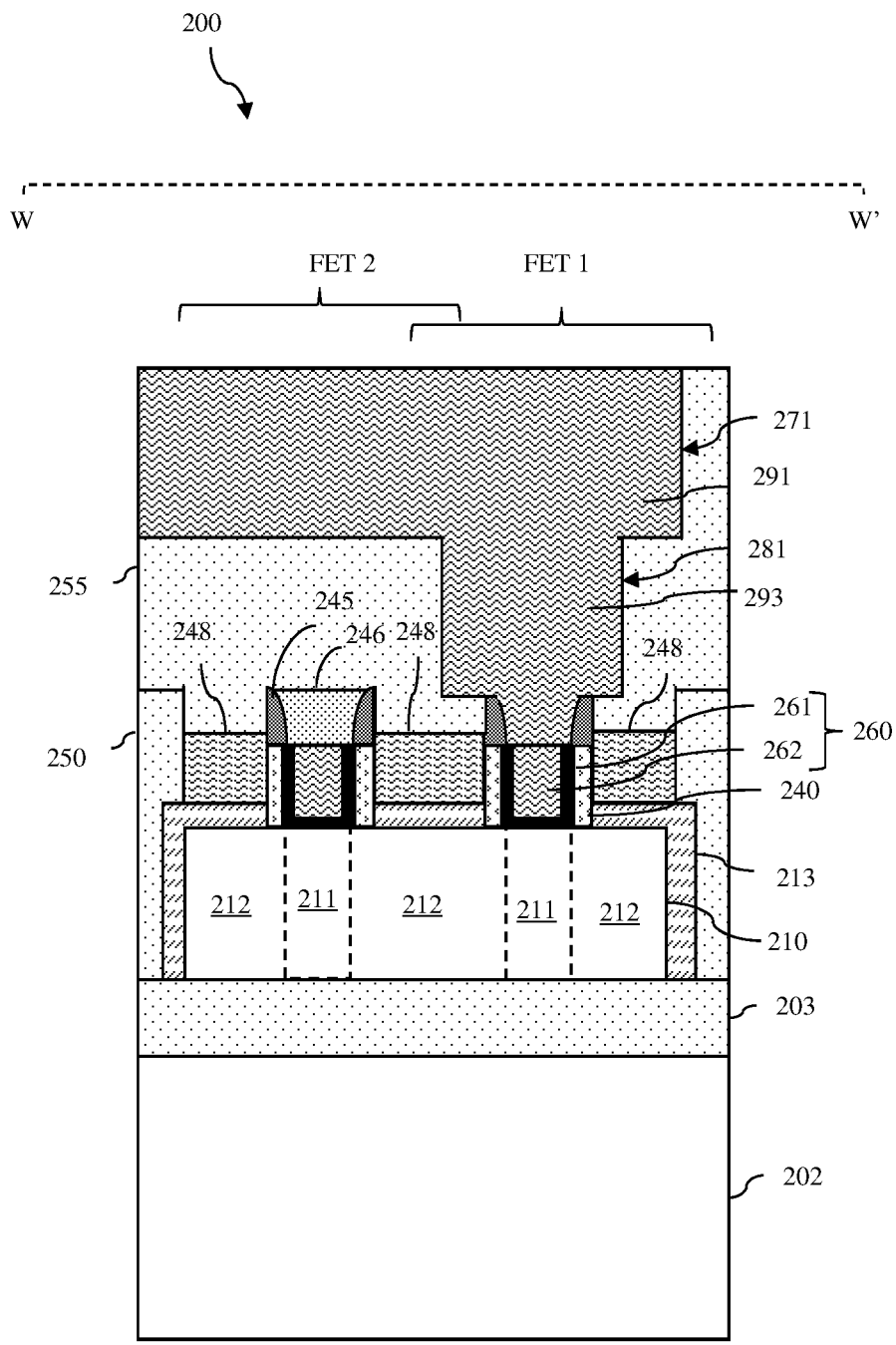
Figure 15C:
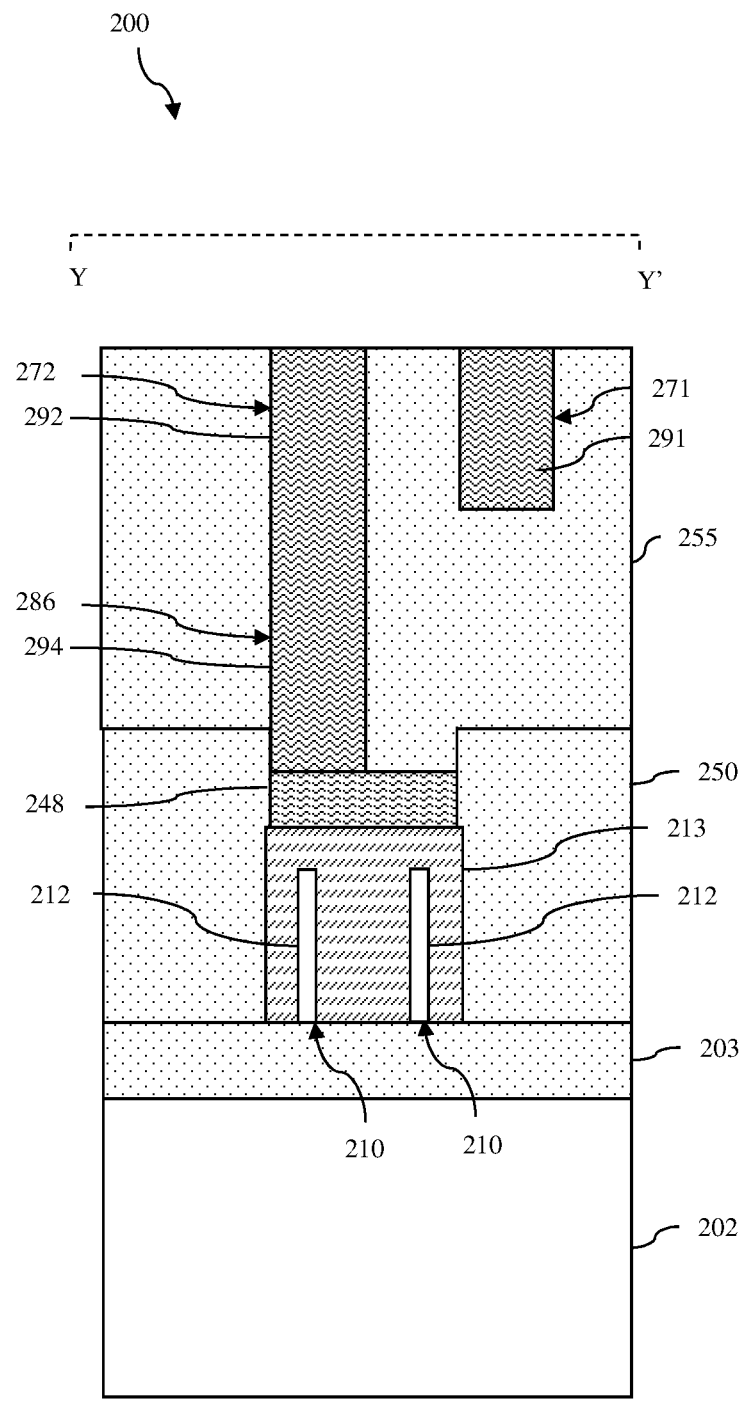
Figure 15D:
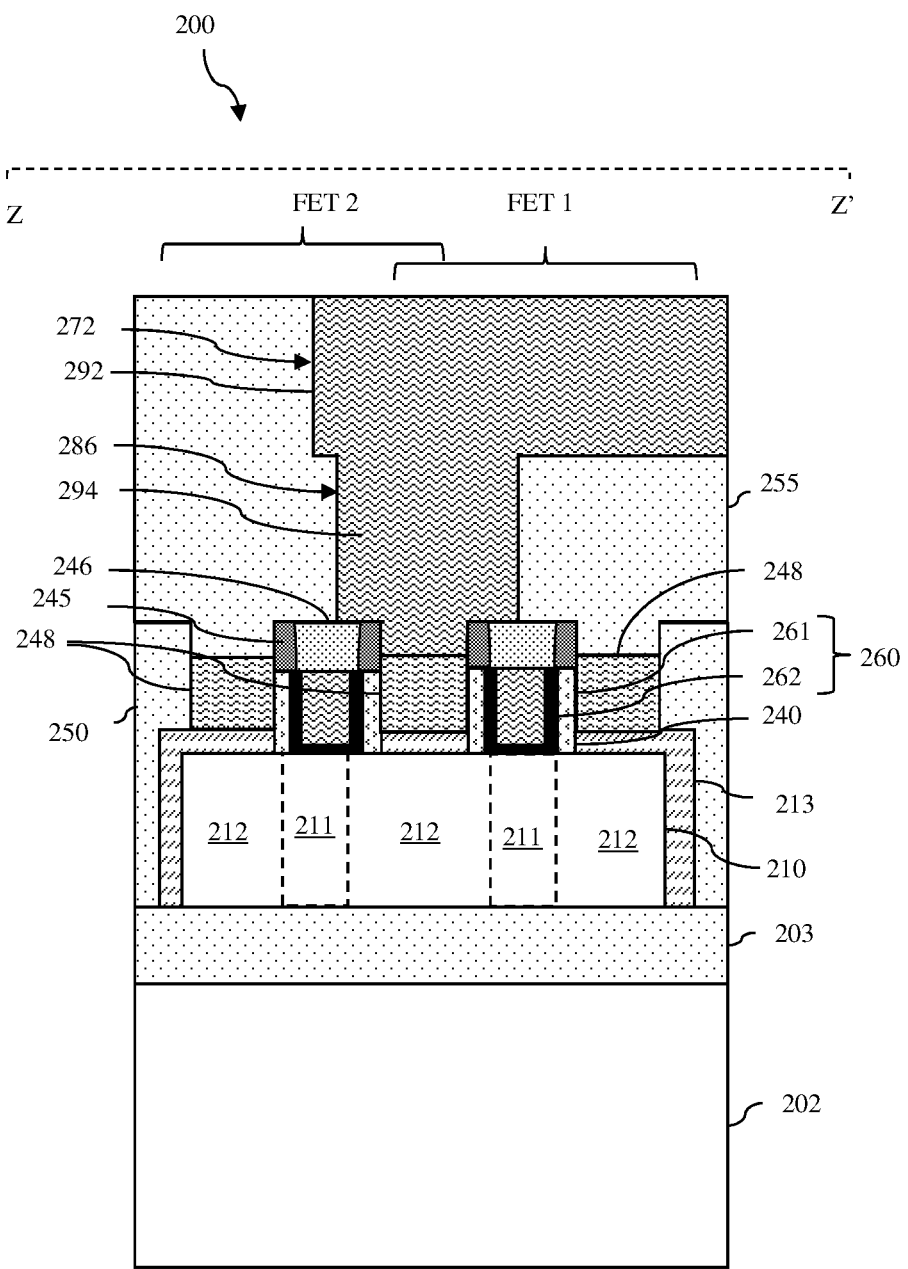

More specifically, as shown in FIGS. 13A-13C, the first contact opening 281 within the first OPL 280 may have a width ($w_{1.1}$), as measured in a first direction (e.g., along the X-X' cross-section) and a length ($l_{1.1}$), as measured in a second direction (e.g., along the W-W' cross-section) that is perpendicular to the first direction. The width ($w_{1.1}$) of the first contact opening 281 may be wider than that of the first trench 271 such that the first contact opening 281 extends in the first direction across opposing sides of the first trench 271 (as illustrated in FIG. 13B). Alternatively, the width ($w_{1.1}$) of the first contact opening 281 may be the same or less than that of the first trench 271, but the first contact opening 281 may be misaligned so that it overlaps one side of the first trench 271 (not shown). Additionally, the length ($l_{1.1}$) of the first contact opening 281 may be longer than the length of the replacement metal gate 260 such that the first contact opening 281 extends in the second direction across the full length of the replacement metal gate 260 and over the dielectric spacer 245 (as illustrated in see FIG. 13C). Alternatively, the length ($l_{1.1}$) of the first contact opening 281 may be the same or less than that of the replacement metal gate 260, but the first contact opening 281 may be misaligned so that it overlaps the dielectric spacer 245 on one side of the replacement metal gate 260 (not shown). However, since the dielectric material of second ILD layer 255 is different from that of the hardmask layer 256 and can be selectively and directionally etched, the width ($w_{1.2}$) of the first contact opening 281, as measured in the first direction, within the lower portion of the second ILD layer 255 will be no greater than the width of the first trench 271. Furthermore, since the dielectric material of the dielectric cap 246 is different from the dielectric material of the dielectric spacer 245 and the second ILD 255 and can be selectively and directionally etched, the length ($l_{1.2}$) of the portion of the first contact opening 281 immediately above the replacement metal gate 260 will be no greater than the length of the replacement metal gate 260. Thus, the width ($w_{1.2}$) and length ($l_{1.2}$) dimensions of the first contact opening 281 are limited and, thus, the resulting contact 293, as shown in FIGS. 15A and 15B, is considered self-aligned in these two dimensions. It should be noted that, optimally, the selective etch process used to etch through the dielectric cap 246 will ensure that etching of the outer edges of the first contact opening 281 stops at the level of the dielectric spacer 245 (as shown in FIG. 13C). However, even if some etching of the outer edges of the first contact opening 281 occurs, metal plugs 248 are recessed, as discussed above, so as to avoid any shorting of the first contact 293 to the metal plug 248. Similarly, as shown in FIGS. 14A-14C, the second contact opening 286 within the second OPL 285 may have a width ($w_{2.1}$), as measured in a first direction (e.g., along the Y-Y' cross-section) and a length ($l_{2.1}$), as measured in a second direction (e.g., along the Z-Z' cross-section) that is perpendicular to the first direction. The width ($w_{2.1}$) of the second contact opening 286 may be wider than that of the second trench 272 such that the second contact opening 286 extends in the first direction across opposing sides of the second trench 272 (as illustrated in FIG. 14B). Alternatively, the width ($w_{2.1}$) of the second contact opening 286 may be the same or less than that of the second trench 272, but the second contact opening 286 may be misaligned so that it overlaps one side of the second trench 272 (not shown). Additionally, the length ($l_{2.1}$) of the second contact opening 286 may be longer than the length of the metal plug 248 such that the second contact opening 286 extends in the second direction across the full length of the metal plug 248, over the dielectric spacer 245 and onto the dielectric cap 246 (as illustrated in see FIG. 14C). Alternatively, the length ($l_{2.1}$) of the second contact opening 286 may be the same or less than that of the metal plug 248, but the second contact opening 286 may be misaligned so that it overlaps the dielectric spacer 245 and dielectric cap 246 on one side of the metal plug 248 (not shown). However, since the dielectric material of second ILD layer 255 is different from that of the hardmask layer 256 and can be selectively and directionally etched, the width ($w_{2.2}$) of the second contact opening 286, as measured in the first direction, within the lower portion of the second ILD layer 255 will be no greater than the width of the second trench. Furthermore, since the dielectric material of the dielectric cap 246 and dielectric sidewall spacer is different from the dielectric material of the second ILD layer 255 and the second ILD 255 and can be selectively and directionally etched, the length ($l_{2.2}$) of the portion of the second contact opening 286 immediately above the metal plug 248 will be no greater than the length of the metal plug 248 between the adjacent replacement metal gates 260. Thus, the width ($w_{2.2}$) and length ($l_{2.2}$) dimensions of the second contact opening 286 are limited and the resulting contact 294, as shown in FIGS. 15C and 15D, is considered self-aligned in these two dimensions.

The two-dimensional self-alignment of the contacts (i.e., the first contact 293 and the second contact 294) effectively eliminates (or at least significantly reduces) the risk of opens occurring between the wires 291, 292 and/or vias (not shown) in the first BEOL metal level and those contacts and further eliminates (or at least significantly reduces) the risk of shorts occurring between the first contact 293 and any metal plugs and between the second contact 294 and the replacement metal gate 260.

Also disclosed herein are integrated circuit (IC) structures formed according to the methods described above. As mentioned above, the IC structures formed according to the disclosed methods can include, but are not limited to, IC structures that incorporate planar FET(s) or non-planar FET(s), IC structures that incorporate FET(s) with multiple semiconductor bodies, IC structures that incorporate FET(s) with conventional gate-first gate(s) or a replacement metal gate(s), etc. For purposes of illustration, FIGS. 15A-15D show different cross-section drawings illustrating one exemplary IC structure 200 formed according to the methods described above. This IC structure 200 has self-aligned MOL contacts 293-294 to multiple non-planar FET 1 and FET 2 (e.g., finFETs), each FET incorporating multiple semiconductor bodies 210 (e.g., multiple semiconductor fins) and a corresponding replacement metal gate 260.

Referring to FIGS. 15A-15D, generally each IC structure disclosed herein can be formed, for example, on a semiconductor-on-insulator (SOI) wafer that includes a semiconductor substrate 202 (e.g., a silicon substrate) and an insulator layer 203 (e.g., a buried oxide (BOX) layer or other suitable insulator layer on the semiconductor substrate) and a semiconductor layer (e.g., a silicon layer or other suitable semiconductor layer) on the insulator layer 203 (as shown). Alternatively, each IC structure can be formed on a bulk semiconductor wafer (e.g., a bulk silicon wafer or other suitable bulk semiconductor wafer).

Each IC structure can include at least one field effect transistor (FET) (e.g., see non-planar FET 1 and FET 2). Each of FET 1 and FET 2 can incorporate one or more semiconductor bodies 210. Each semiconductor body 210 can be, for example, a fin-shaped semiconductor body (i.e., a relatively thing rectangular shaped semiconductor body). Each semiconductor body 210 can include at least one channel region 211 positioned laterally between source/drain regions 212. For purposes of illustration, in the IC structure 200 shown in FIGS. 15A-15D, each semiconductor body 210 includes two channel regions (one for each of FET 1 and FET 2) and further includes a shared source/drain region between the two channel regions. In any case, the channel region(s) 211 can, for example, be doped with a first dopant so as to have a first conductivity at a relatively low conductivity level.

Each FET can further have a gate 260 (e.g., a conventional gate-first gate or a replacement metal gate, as shown). For purposes of illustration, in the IC structure 200 shown in FIGS. 15A-15D, two gates 260 are shown (one for each of FET 1 and FET 2) and each gate 260 traverses the semiconductor bodies 210 at adjacent channel regions. A gate sidewall spacer 240 can be positioned laterally adjacent to the sidewalls of each gate 260 so as to laterally surround the gate 260. The gate sidewall spacer 240 can be made of a dielectric material. This dielectric material can be, for example, silicon nitride, silicon carbon nitride, silicon boron carbon nitride or any other suitable gate sidewall spacer material. Additionally, a dielectric cap 246 can be on the top surface of each gate 260. The dielectric cap 246 can be made of the same dielectric material as the gate sidewall spacer 240 or a different dielectric material. A dielectric spacer 245 can be above the gate sidewall spacer 240 so as to laterally surround and be immediately adjacent to the dielectric cap 246. The dielectric spacer 245 can be made of a different dielectric material than that used for the dielectric cap 246 and gate sidewall spacer 240. Thus, for example, the dielectric spacer 245 may be made of silicon oxycarbide or another other suitable dielectric material, as discussed in greater detail below.

Optionally, epitaxial semiconductor material (e.g., epitaxial silicon or any other suitable epitaxial semiconductor material) can be on each semiconductor body 210 at the source/drain regions 212, thereby creating a raised first source/drain region 213. For example, as illustrated in FIGS. 15A-15D, the epitaxial semiconductor material can be on the top surface and opposing sidewalls of each of the semiconductor bodies 210 at the source/drain regions 212 (including the source/drain regions that are shared by FET 1 and FET 2). Optionally, the epitaxial semiconductor material on the source/drain regions 212 of adjacent semiconductor bodies 210 can be merged into a single region, as illustrated. In any case, the source/drain regions 212 and, if applicable, the raised source/drain regions 213 can, for example, be doped with a second dopant so as to have a second type conductivity at a relatively high conductivity level.

Each IC structure can further include a first interlayer dielectric (ILD) layer 250 positioned laterally immediately adjacent to each gate sidewall spacer 240 and above the source/drain regions 212 (or, if applicable, above the raised source/drain regions 213). The first ILD layer 250 can be, for example, a silicon oxide layer or a layer of any other suitable dielectric material that is different from that of the dielectric spacer 245 and dielectric cap 246 adjacent each gate 260.

Recessed metal plugs 248 can be within metal plug openings in the first ILD layer 250 above and immediately adjacent to the source/drain regions 212 (or, if applicable, above and immediately adjacent to the raised source/drain regions 213, as illustrated). The recessed metal plugs 248 may have top surfaces that are at the same level, lower than, or higher than the top surface of an adjacent gate 260. In any case, the recessed metal plugs 248 will have top surfaces that are below the level of the top surface of the dielectric cap 246 on that adjacent gate 260. Thus, each recessed metal plug 248 will be positioned laterally adjacent to a gate sidewall spacer 240 opposite a gate 260 and, depending upon the height of the metal plugs 248, also positioned laterally adjacent to a dielectric spacer 245 opposite a dielectric cap 246 (as illustrated).

Each IC structure can further have both middle of the line (MOL) contacts and back end of the line (BEOL) metal levels. That is, at least one dielectric layer can be above the first ILD layer 250. For example, a second ILD layer 255 can be above the first ILD layer 250. More specifically, a second ILD layer 255 can cover the top surfaces of the first ILD layer 250, the dielectric cap 246 on each gate 260, and the dielectric spacer 245 on each gate sidewall spacer 240. This second ILD layer 255 can also fill the recesses above the metal plugs 248 such that second ILD layer 255 covers the top surfaces of the metal plugs 248 and is also positioned laterally adjacent to the dielectric spacer 240 opposite each dielectric cap 246. This second ILD layer 255 can, for example, be the same dielectric material (e.g., silicon oxide) as the first ILD layer 250.

Metal wires 291-292 can fill trenches 271-272 that are patterned and etched into an upper portion of the second ILD layer 255. Additionally, contacts 293-294 can extend from the metal wires 291-292 through a lower portion of the second ILD layer 255. The contacts can include, but are not limited to, a first contact 293 that extends from a first wire 291 through the lower portion of the stack and through one of the dielectric caps 246 to a gate 260 and a second contact 294 that extends from a second wire 292 through the lower portion of the stack to a metal plug 248. It should be noted that, in the IC structures, the dielectric cap 246 on each gate 260, the dielectric spacer 245 that laterally surrounds and is immediately adjacent to a dielectric cap 246, and the dielectric layers in the stack are all specifically made of different dielectric materials such that the first contact 293 and the second contact 294 are each self-aligned (e.g., in two different dimensions, as discussed in greater detail above with regard to the method).

In order to avoid clutter in the drawings used to illustrate the disclosed methods and structures and, particularly, in order to adequately illustrate each of the different types of self-aligned MOL contacts (i.e., a first contact 293 to a gate 260 and a second contact 294 to a meal plug 248) that can be formed according to the disclosed methods and that can be incorporated into the disclosed structures, only two such contacts 293, 294 are shown in the Figures. However, it should be understood that an IC structure formed according to the disclosed methods can include multiple instances of the contacts 293, 294 such that the gates and source/drain regions of the IC structure are contacted, as necessary, to ensure proper functioning.

In the methods and structures described above, for an N-type FET, the first type conductivity of the channel region(s) can be a P-type conductivity and the second type conductivity of the source/drain regions can be an N-type conductivity; whereas, for a P-type FET, the first type conductivity of the channel region(s) can be an N-type conductivity and the second type conductivity of the source/drain regions can be a P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of forming an integrated circuit (IC) structure with self-aligned middle of the line (MOL) contacts to at least one field effect transistor (FET). In the methods, different, selectively etchable, dielectric materials are used above the gate level for at least the following: a dielectric cap above a gate; a dielectric spacer above a gate sidewall spacer and laterally surrounding the dielectric cap; and at least one dielectric layer that covers the dielectric cap, the dielectric spacer, and metal plugs positioned laterally adjacent to the dielectric spacer and above source/drain regions. Trenches can be formed in an upper portion of the at least one dielectric layer and contact openings can be formed from the trenches to the gate and the metal plugs. Metal can then be deposited to form wires and/or vias in the trenches for a first back end of the line (BEOL) metal level and to form contacts, including a gate contact and a source/drain contact, in the contact openings. Due to the different dielectric materials used above the gate level, the gate and source/drain contacts will be self-aligned (e.g., in two different dimensions) to provide protection against the occurrence of opens between wires and/or vias in the first BEOL metal level and the various contacts and to further provide protection against the occurrence of shorts between the gate contact and any metal plugs and between the source/drain contacts and the gate. Also disclosed herein are IC structures formed according to the methods.

What is claimed is:
1. A method comprising:
forming at least one dielectric layer over a dielectric cap, a dielectric spacer, and metal plugs,
wherein the dielectric cap is above and immediately adjacent to a gate,
wherein a gate sidewall spacer is positioned laterally immediately adjacent to the gate,
wherein the gate is above a channel region,
wherein the channel region is positioned laterally between source/drain regions, wherein the dielectric spacer is above and immediately adjacent to a top surface of the gate sidewall spacer and laterally surrounds and is immediately adjacent to the dielectric cap, and wherein the metal plugs are above the source/drain regions and positioned laterally adjacent to the gate sidewall spacer and the dielectric spacer that is above the gate sidewall spacer;

forming trenches in an upper portion of the at least one dielectric layer;

forming contact openings that extend from the trenches through a lower portion of the at least one dielectric layer, the contact openings comprising at least a first contact opening that extends through the lower portion and the dielectric cap to the gate and a second contact opening that extends through the lower portion to a metal plug; and depositing metal to form wires in the trenches, a first contact in the first contact opening and a second contact in the second contact opening, wherein the dielectric cap, the dielectric spacer, and the at least one dielectric layer comprise different dielectric materials.

2. The method of claim 1, the different dielectric materials ensuring that the first contact and the second contact are self-aligned.

3. The method of claim 1, the first contact opening landing on the gate adjacent to an active region.

4. The method of claim 1,
the at least one dielectric layer comprising: an interlayer dielectric layer; and a hardmask layer above the interlayer dielectric layer, and
the different dielectric materials being preselected so that the interlayer dielectric layer is selectively etchable against the hardmask layer, the dielectric cap and the dielectric spacer and
the different dielectric materials further being preselected so that the dielectric cap is selectively etchable against the interlayer dielectric layer, the hardmask layer and the dielectric spacer.

5. The method of claim 4, the different dielectric materials comprising titanium nitride for the hardmask layer, silicon oxide for the interlayer dielectric layer, silicon nitride for the dielectric cap and silicon oxycarbide for the dielectric spacer.

6. The method of claim 1, the gate sidewall spacer and the dielectric cap comprising a same dielectric material.

7. The method of claim 1, the gate sidewall spacer and the dielectric cap comprising two different dielectric materials.

8. The method of claim 1, the gate and the metal plugs having top surfaces at different levels.

9. A method comprising:
planarizing a first interlayer dielectric layer to expose sacrificial gates and gate sidewall spacers, each sacrificial gate being above channel regions in adjacent semiconductor bodies;
replacing the sacrificial gates with replacement metal gates;
recessing the replacement metal gates and the gate sidewall spacers;
forming dielectric spacers on exposed vertical surfaces of the first interlayer dielectric layer above the gate sidewall spacers;
forming dielectric caps on the replacement metal gates, each dielectric cap being laterally surrounded by and immediately adjacent to a dielectric spacer;

forming metal plug openings that extend through the first interlayer dielectric layer to raised source/drain regions, the raised source/drain regions being positioned laterally adjacent to the gate sidewall spacers and above source/drain regions that are in the semiconductor bodies on opposing sides of the channel regions;

forming metal plugs in the metal plug openings;
recessing the metal plugs;
forming a stack of dielectric layers over the dielectric caps, the dielectric spacers, and the metal plugs, the stack comprising a second interlayer dielectric layer and a hardmask layer on the second interlayer dielectric layer;
forming trenches in an upper portion of the stack;
forming contact openings that extend from the trenches through a lower portion of the stack, the contact openings comprising at least a first contact opening that extends through the lower portion and a dielectric cap to a replacement metal gate and a second contact opening that extends through the lower portion to a metal plug; and
depositing metal to form wires in the trenches, a first contact in the first contact opening and a second contact in the second contact opening,
wherein the dielectric caps, the dielectric spacers, and each of the dielectric layers in the stack comprise different dielectric materials.

10. The method of claim 9, the different dielectric materials ensuring that the first contact and the second contact are self-aligned in two dimensions.

11. The method of claim 9, the first contact opening landing on the replacement metal gate adjacent to an active region.

12. The method of claim 9,
the different dielectric materials being preselected so that the second interlayer dielectric layer is selectively etchable against the hardmask layer, the dielectric caps and the dielectric spacers, and
the different dielectric materials further being preselected so that the dielectric caps are selectively etchable against the second interlayer dielectric layer, the hardmask layer and the dielectric spacers.

13. The method of claim 9, the different dielectric materials comprising titanium nitride for the hardmask layer, silicon oxide for the second interlayer dielectric layer, silicon nitride for the dielectric caps and silicon oxycarbide for the dielectric spacers.

14. The method of claim 9, the gate sidewall spacers and the dielectric caps comprising a same dielectric material.

15. The method of claim 9, the gate sidewall spacers and the dielectric caps comprising two different dielectric materials.

16. The method of claim 9, the recessing being performed such that the replacement metal gates and the metal plugs having top surfaces at different levels.

17. A method comprising:
forming at least one dielectric layer over a dielectric cap, a dielectric spacer, and metal plugs,
wherein the dielectric cap is above a gate,
wherein the gate has gate sidewall spacers and is adjacent to a channel region,
wherein the channel region is positioned laterally between source/drain regions,
wherein the dielectric spacer is above the gate sidewall spacer and laterally surrounds and is immediately adjacent to the dielectric cap, and wherein the metal plugs are above the source/drain regions and positioned laterally adjacent to the dielectric spacer;
forming trenches in an upper portion of the at least one dielectric layer;
forming contact openings that extend from the trenches through a lower portion of the at least one dielectric layer, the contact openings comprising at least a first contact opening that extends through the lower portion and the dielectric cap to the gate and a second contact opening that extends through the lower portion to a metal plug; and
depositing metal to form wires in the trenches, a first contact in the first contact opening and a second contact in the second contact opening,
wherein the at least one dielectric layer comprises: an interlayer dielectric layer; and a hardmask layer above the interlayer dielectric layer, and
wherein the hardmask layer, the interlayer dielectric layer, the dielectric cap and the dielectric spacer comprise different dielectric materials, and
wherein the different dielectric materials comprise titanium nitride for the hardmask layer, silicon oxide for the interlayer dielectric layer, silicon nitride for the dielectric cap and silicon oxycarbide for the dielectric spacer.

18. The method of claim 17, the different dielectric materials ensuring that the first contact and the second contact are self-aligned.

19. The method of claim 17, the first contact opening landing on the gate adjacent to an active region.

20. The method of claim 17,
the different dielectric materials being preselected so that the interlayer dielectric layer is selectively etchable against the hardmask layer, the dielectric cap and the dielectric spacer, and
the different dielectric materials further being preselected so that the dielectric cap is selectively etchable against the interlayer dielectric layer, the hardmask layer and the dielectric spacer.

* * * * *